(12) United States Patent
Williamson et al.

(10) Patent No.: US 8,415,087 B2
(45) Date of Patent: Apr. 9, 2013

(54) METHOD OF MAKING A LITHOGRAPHIC PRINTING PLATE

(75) Inventors: Alexander Williamson, Mortsel (BE);
Christel Geukens, Mortsel (BE);
Hubertus Van Aert, Pulderbos (BE);
Kristof Heylen, Hechtel-Eksel (BE)

(73) Assignee: AGFA Graphics NV, Morsel (BE)

( * ) Notice: Subject to any disclaimer, the term of this patent is extended or adjusted under 35 U.S.C. 154(b) by 0 days.

(21) Appl. No.: 12/738,901

(22) PCT Filed: Nov. 13, 2008

(86) PCT No.: PCT/EP2008/065506
§ 371 (c)(1),
(2), (4) Date: Apr. 20, 2010

(87) PCT Pub. No.: WO2009/063024
PCT Pub. Date: May 22, 2009

(65) Prior Publication Data
US 2010/0209851 A1     Aug. 19, 2010

Related U.S. Application Data

(60) Provisional application No. 60/988,923, filed on Nov. 19, 2007.

(30) Foreign Application Priority Data

Nov. 16, 2007  (EP) .................................. 07120845

(51) Int. Cl.
| | |
|---|---|
| G03F 7/027 | (2006.01) |
| G03F 7/028 | (2006.01) |
| G03F 7/032 | (2006.01) |
| G03F 7/11 | (2006.01) |
| G03F 7/26 | (2006.01) |
| B41N 1/08 | (2006.01) |

(52) U.S. Cl. .................. 430/302; 430/270.1; 430/271.1; 430/272.1; 430/281.1; 430/300; 101/453; 101/463.1

(58) Field of Classification Search ............... 430/270.1, 430/271.1, 278.1, 281.1, 300, 302, 272.1
See application file for complete search history.

(56) References Cited

U.S. PATENT DOCUMENTS

| | | | |
|---|---|---|---|
| 5,973,588 A * | 10/1999 | Cowman et al. ............ 338/21 |
| 6,027,857 A | 2/2000 | Li et al. | |
| 6,071,675 A | 6/2000 | Teng | |
| 6,171,735 B1 | 1/2001 | Li et al. | |
| 6,245,481 B1 | 6/2001 | Teng | |
| 6,387,595 B1 | 5/2002 | Teng | |
| 6,420,089 B1 | 7/2002 | Baumann et al. | |
| 6,482,571 B1 | 11/2002 | Teng | |
| 6,548,222 B2 | 4/2003 | Teng | |
| 6,576,401 B2 | 6/2003 | Teng | |
| 7,045,266 B2 * | 5/2006 | Mase et al. ................. 430/270.1 |
| 7,700,265 B2 * | 4/2010 | Hoshi et al. ................. 430/302 |
| 2003/0165777 A1 | 9/2003 | Teng | |
| 2004/0013968 A1 | 1/2004 | Teng | |
| 2004/0131974 A1 | 7/2004 | Suzuki | |
| 2004/0214105 A1 | 10/2004 | Hoshi et al. | |
| 2005/0003285 A1 * | 1/2005 | Hayashi et al. ................. 430/56 |
| 2005/0039620 A1 | 2/2005 | Kakino et al. | |
| 2006/0046196 A1 | 3/2006 | Hunter et al. | |

FOREIGN PATENT DOCUMENTS

| | | | |
|---|---|---|---|
| EP | 0 851 299 A1 | 7/1998 | |
| EP | 1 091 251 A2 | 4/2001 | |
| EP | 1 342 568 A1 | 9/2003 | |
| EP | 1 491 356 A2 | 12/2004 | |
| EP | 1 495 866 A2 | 1/2005 | |
| EP | 1 500 498 A2 | 1/2005 | |
| EP | 1 520 694 A2 | 4/2005 | |
| EP | 1 557 262 A2 | 7/2005 | |
| EP | 1 584 470 A2 | 10/2005 | |
| EP | 1 669 194 A1 | 6/2006 | |
| JP | 2-304441 A | 12/1990 | |
| JP | 10-282679 A | 12/1990 | |
| WO | 02/101469 A1 | 12/2002 | |
| WO | WO 2005/091068 | * | 9/2005 |
| WO | 2005/111727 A1 | 11/2005 | |
| WO | 2007/057409 A1 | 5/2007 | |

OTHER PUBLICATIONS

HPV Assessment Report on Benzenesulphonic acid, CAS No. 98-11-3, submitted on behalf of the Aromatic Sulfonic Acids Association, prepared by NOTOX Safety and Environmental Research BV, Sep. 12, 2003.*

* cited by examiner

*Primary Examiner* — Anca Eoff
(74) *Attorney, Agent, or Firm* — Leydig, Voit & Mayer, Ltd.

(57) ABSTRACT

Disclosed is a method of making a lithographic printing plate which includes providing a lithographic printing plate precursor having a coating therein, image-wise exposing the coating, and developing the precursor. The coating includes (i) a contiguous photopolymerizable layer of a photopolymerizable composition or (ii) a contiguous intermediate layer with a photopolymerizable layer of a photopolymerizable composition thereon. The photopolymerizable composition includes a polymerizable compound, a polymerization initiator and a first polymer. The contiguous photopolymerizable layer or the contiguous intermediate layer also includes an adhesion promoting compound and a second polymer.

28 Claims, No Drawings

METHOD OF MAKING A LITHOGRAPHIC PRINTING PLATE

FIELD OF THE INVENTION

The present invention relates to a method for making a lithographic printing plate whereby a negative-working photopolymer printing plate precursor is image-wise exposed and developed with a gum solution or on-press with fountain and ink. The present invention relates also to the lithographic printing plate precursor and to a method of making the precursor.

BACKGROUND OF THE INVENTION

In lithographic printing, a so-called printing master such as a printing plate is mounted on a cylinder of the printing press. The master carries a lithographic image on its surface and a printed copy is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called "driographic" printing, the lithographic image consists of ink-accepting and ink-adhesive (ink-repelling) areas and during driographic printing, only ink is supplied to the master.

Printing masters are generally obtained by the so-called computer-to-film (CtF) method, wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master. Since about 1995, the so-called 'computer-to-plate' (CtP) method has gained a lot of interest. This method, also called 'direct-to-plate', bypasses the creation of film because the digital document is transferred directly to a printing plate precursor by means of a so-called plate-setter. A printing plate precursor for CtP is often called a digital plate.

Digital plates can roughly be divided in three categories: (i) silver plates, which work according to the silver salt diffusion transfer mechanism; (ii) photopolymer plates which contain a photopolymerizable composition that hardens upon exposure to light and (iii) thermal plates of which the imaging mechanism is triggered by heat or by light-to-heat conversion. Thermal plates are mainly sensitized for infrared lasers emitting at 830 nm or 1064 nm. Photopolymers can be sensitized for blue, green or red light (i.e. wavelength range between 450 and 750 nm), for violet light (i.e. wavelength range between 350 and 450 nm) or for infrared light (i.e. wavelength range between 750 and 1500 nm). Laser sources have been increasingly used to expose a printing plate precursor which is sensitized to a corresponding laser wavelength. Typically, an Ar laser (488 nm) or a FD-YAG laser (532 nm) can be used for exposing a visible light sensitized photopolymer plate. The wide-scale availability of low cost blue or violet laser diodes, originally developed for data storage by means of DVD, has enabled the production of plate-setters operating at shorter wavelength. More specifically, semiconductor lasers emitting from 350 to 450 nm have been realized using an InGaN material. An infrared laser diode emitting around 830 nm or a Nd-YAG laser emitting around 1060 nm can also be used.

Typically, a photopolymer plate is processed in alkaline developer having a pH>10. Currently, most commercial lithographic plates require an additional gumming process after the exposed plates is developed and before it is put on the press, in order to protect the plate from contamination, e.g. by oxidation, fingerprints, fats, oil or dust, or from damaging, e.g. by scratches during handling of the plate. Such an additional gumming step is not convenient for the end-user, because it is a time consuming step and requires an additional gumming station.

WO 02/101 469 discloses a method of processing an imageable element useful as alkaline-developable lithographic printing plate precursor wherein the element is developed and gummed with an aqueous alkaline developing-gumming solution comprising a water-soluble polyhydroxy compound having a specific structure.

EP 1 342 568 discloses a method for making a heat-sensitive lithographic printing plate wherein the image-wise heated precursor, comprising a coating of hydrophobic thermoplastic polymer particles which coalescence on heating, is developed with a gum solution. A practical embodiment for this type of printing plates was introduced by Agfa under the tradename Azura.

In U.S. Pat. No. 6,027,857, U.S. Pat. No. 6,171,735, U.S. Pat. No. 6,420,089, U.S. Pat. No. 6,071,675, U.S. Pat. No. 6,245,481, U.S. Pat. No. 6,387,595, U.S. Pat. No. 6,482,571, U.S. Pat. No. 6,576,401, WO 93/05446, WO 03/087939, US 2003/16577, US 2004/13968 and US 2006/0046196 a method is disclosed for preparing a lithographic printing plate wherein a photopolymer plate, after image-wise exposure, is mounted on a press and processed on-press by applying ink and fountain to remove the unexposed areas from the support. An adhesion promoting compound can also added to the printing plate precursor for improving the durability of the plate in the printing process. Typically, these compounds have an ethylenically unsaturated bond and a functional group capable of adsorbing to the surface of the support. The compound can be present in the photopolymerisble layer or in an intermediate layer between the support and the photopolymerisable layer as disclosed in EP 851 299, EP 1 091 251, US 2004/214105, EP 1 491 356, US 2005/39620, EP 1 495 866, EP 1 500 498, EP 1 520 694 and EP 1 557 262.

EP 1 669 194 discloses a lithographic printing plate precursor comprising, on a porous aluminum support, a layer containing a water-soluble polymer having a hydrophilic substituent absorbable to a surface of the porous aluminum support and a sulfonic acid, and an image recording layer.

WO 2007/57409 discloses a method of making a lithographic printing plate wherein a coating is provided on a support comprising a photopolymerisable layer and optionally an intermediate layer. The photopolymerisable layer or the intermediate layer comprises an adhesion promoting compound.

WO 2005/111727 discloses a method for making a lithographic printing plate wherein the image-wise exposed precursor, comprising an adhesion promoting compound and a polymeric binder in an amount of at least 10% by weight, is developed with a gumming solution.

A problem associated with these lithographic printing plate precursors, comprising an adhesion promoting compound, is an insufficient clean-out of the non-exposed areas, even after printing a high number of sheets, especially when the plate is processed under non-aggressive conditions such as processing without the presence of a strong alkaline (pH≧12) solution. Examples of a processing under non-aggressive conditions are an off-press is processing with a gum solution or an on-press processing with fountain and ink. These processing methods are environmentally friendly and highly desired by the customer as "chemistry free processing methods".

SUMMARY OF THE INVENTION

It is an object of the present invention to provide a method for making a lithographic printing plate, having a high resolution, an excellent clean-out and a high run length, by means of a photopolymer plate precursor, which is processed off-press with a gum solution or on-press with fountain and ink while printing. This object is realized by the method defined in claim 1, having the specific feature that (1) an adhesion promoting compound which is a non-polymeric compound containing a group having an ethylenically unsaturated bond and a group capable of interacting with the support selected from a phosphate group, a phosphonate group and a trialkoxysilane group, and (2) a second polymer having at least 1 mol % of a first monomeric unit having a group capable of interacting with the support such as a phosphate group, a phosphonate group, a carboxylic acid group, a sulphonic acid group, a phenolic group, a trialkoxysilane group, an ammonium group or a phosphonium group and at least 30 mol % of a second monomeric unit having a hydrophilic group are both together present in that layer which is contiguous to the support and wherein the amount of said adhesion promoting compound is higher than the amount of said second polymer. Hereinafter, this layer is also referred to as "contiguous layer", this adhesion promoting compound is also referred to as "AP compound" or "APC", and this second polymer is also referred to as "hydrophilic polymer". The inventors unexpectedly found that, when a photopolymerizable layer is the contiguous layer, the amount of this polymer in the photopolymerizable layer needs to be at least 0.01% by weight and less than 5% by weight. When higher amounts of this polymer are used, the contiguous layer shows poor resistance of the imaged areas on press. The inventors also found that, when this polymer is not present in the contiguous layer, the clean-out is insufficient and this insufficient clean-out results in toning on printing. An insufficient clean-out means that the non-exposed areas are not completely removed from the support or that the compounds remaining on the support in the non-exposed areas after processing are too hydrophobic and, as a result, the hydrophilic property of the surface of the support is reduced. An insufficient clean-out may further result in toning on the press, i.e. an undesirable increased tendency of ink-acceptance in the non-image areas of the prints. The adhesion promoting compound needs to be present in the contiguous layer, to improve the resolution of the image formed on the plate.

It is also important that the precursor exhibits an improved shelf-life stability, i.e. an excellent clean-out and no toning when the precursor has been stored under critical conditions of high temperature and high relative humidity before imaging and processing. For the specific precursors wherein a photopolymerizable layer is the contiguous layer, it is found that, when an acid having a pKa-value of less than 4 is further added to the photopolymerisable layer, an excellent clean-out and no toning is observed in the method for making a lithographic printing plate as defined above. It is further found this acid is preferably added to the coating solution in the preparation of the precursor before the addition of the second polymer to the coating solution.

Other specific embodiments of the invention are defined in the other claims.

DETAILED DESCRIPTION OF THE INVENTION

In accordance with the present invention, there is provided a method of making a lithographic printing plate comprising the steps of:

a) providing a lithographic printing plate precursor comprising a support having a hydrophilic surface or which is provided with a hydrophilic layer, and a coating provided thereon, said coating comprising (i) a contiguous photopolymerisable layer having a photopolymerisable composition, or (ii) a contiguous intermediate layer and thereon a photopolymerisable layer having a photopolymerisable composition, wherein said photopolymerisable composition comprises a polymerisable compound, a polymerization initiator and a first polymer, b) image-wise exposing said coating, c) optionally, heating the precursor, d) developing the precursor by treating the coating of the precursor with a gum solution or by mounting the exposed precursor on a plate cylinder of a lithographic printing press and rotating the plate cylinder while feeding dampening liquid and/or ink to the coating, wherein said contiguous photopolymerisable or intermediate layer further comprises (1) an adhesion promoting compound which is a non-polymeric compound containing a group having an ethylenically unsaturated bond and a group selected from a phosphate group, a phosphonate group and a trialkoxysilane group, and (2) a second polymer having at least 1 mol % of a first monomeric unit having a phosphate group, a phosphonate group, a carboxylic acid group, a sulphonic acid group, a phenolic group, a trialkoxysilane group, an ammonium group or a phosphonium group and at least 30 mol % of a second monomeric unit having a hydrophilic group, wherein the amount of said adhesion promoting compound is higher than the amount of said second polymer, with the proviso that, if the contiguous layer is the photopolymerisable layer, the amount of said second polymer in the photopolymerisable layer is at least 0.01% by weight and less than 5% by weight.

In another embodiment of the present invention, said photopolymerisable layer, when the contiguous layer is the photopolymerisable layer, further comprises an acid having a pKa-value of less than 4.

In accordance with a preferred embodiment of the present invention, said acid has a pKa-value of less than 2.5, more preferably less than 1, most preferably less than −0.5. Such acids are preferably inorganic acids or organic sulphonic acids.

For an acid having more than one acid function such as sulphuric acid and phosphoric acid, the pKa-value in the present invention is defined by the pKa-value of the first dissociation, indicated by pKa1.

Examples of such inorganic acids are preferably hydrochloric acid (pKa=−7), hydrobromic acid (pKa=−9), hydroiodic acid (pKa=−10), perchloric acid (pKa=−10), sulphuric acid (pKa1=−7), sulphurous acid, nitric acid (pKa=−1.4), phosphoric acid (pKa1=2.2), pyrophosphoric acid (pKa1=0.85), hypophosphoric acid (pKa1=2.2), triphosphoric acid (pKa1=0), more preferably hydrochloric acid, sulphuric acid, phosphoric acid, pyrophosphoric acid, hypophosphoric acid and nitric acid.

The organic sulphonic acid is preferably an optionally substituted aryl or heteroaryl sulphonic acid, wherein the aryl group is preferably a phenyl group or a naphthyl group.

Examples of such organic sulphonic acids are para-toluene sulphonic acid (pKa=−6.5), benzene sulphonic acid, naphthalene sulphonic acid and 5-sulfosalicylic acid, more preferably para-toluene sulphonic acid, 5-sulfosalicylic acid and benzene sulphonic acid.

In accordance with a more preferred embodiment of the present invention, said acid is selected from the list consisting of hydrochloric acid, hydrobromic acid, hydroiodic acid, perchloric acid, sulphuric acid, sulphurous acid, nitric acid, phosphoric acid, pyrophosphoric acid, hypophosphoric acid, para-toluene sulphonic acid, 5-sulfosalicylic acid and benzene sulphonic acid.

In accordance with another embodiment of the present invention, there is provided a lithographic printing plate precursor comprising
- a support having a hydrophilic surface or which is provided with a hydrophilic layer, and
- a coating provided thereon, said coating comprising (i) a contiguous photopolymerisable layer having a photopolymerisable composition, or (ii) a contiguous intermediate layer and thereon a photopolymerisable layer having a photopolymerisable composition, wherein said photopolymerisable composition comprises a polymerisable compound, a polymerization initiator and a first polymer, wherein said contiguous photopolymerisable or intermediate layer further comprises (1) an adhesion promoting compound which is a non-polymeric compound containing a group having an ethylenically unsaturated bond and a group selected from a phosphate group, a phosphonate group and a trialkoxysilane group, and (2) a second polymer having at least 1 mol % of a first monomeric unit having a phosphate group, a phosphonate group, a carboxylic acid group, a sulphonic acid group, a phenolic group, a trialkoxysilane group, an ammonium group or a phosphonium group and at least 30 mol % of a second monomeric unit having a hydrophilic group, wherein the amount of said adhesion promoting compound is higher than the amount of said second polymer, with the proviso that, if the contiguous layer is the photopolymerisable layer, the amount of said second polymer in the photopolymerisable layer is at least 0.01% by weight and less than 5% by weight, and wherein said photopolymerisable coating layer is capable of being removed by applying a gum solution and optionally brushing the precursor, or by mounting the precursor on a plate cylinder of a lithographic printing press and rotating the plate cylinder while feeding dampening liquid and/or ink to the coating layer.

In accordance with another embodiment of the present invention, there is provided a method of making a lithographic printing plate precursor comprising the steps of
1) providing a support having a hydrophilic surface or which is provided with a hydrophilic layer;
2) preparing a photopolymerisable coating solution by adding photopolymerisable coating ingredients to a solvent or a mixture of solvents and mixing the added ingredients, said ingredients comprise
- a polymerizable compound,
- a polymerization initiator,
- a first polymer,
- an adhesion promoting compound as defined above,
- a second polymer as defined above, and
- an acid having a pKa-value of less than 4,
3) forming a photopolymerisable coating layer by coating said coating solution on the hydrophilic surface or hydrophilic layer of the support, wherein the amount of said adhesion promoting compound is higher than the amount of said second polymer, wherein the amount of said second polymer in the photopolymerisable layer is at least 0.01% by weight and less than 5% by weight, wherein said photopolymerisable coating layer is capable of being removed by applying a gum solution and optionally brushing the precursor, or by mounting the precursor on a plate cylinder of a lithographic printing press and rotating the plate cylinder while feeding dampening liquid and/or ink to the coating layer, and wherein, in the preparation of the coating solution in step 2), said acid is added and mixed before said second polymer is added and mixed.

The solvent or mixture of solvents wherein the ingredients are solubilized or dispersed comprises at least an organic solvent, optionally in combination with water. The organic solvent can be selected of a carboxylic acid ester as ethyl acetate, propyl acetate, butyl acetate, amyl acetate, benzyl acetate, ethylene glycol monobutyl ether acetate, butyl lactate and butyl levulinate; a ketone as acetone, butanone, ethyl butyl ketone, methyl isobutyl ketone and cyclohexanone; an alcohol or an ether as methanol, ethanol, propanol, butanol, ethylenegycol, propyleneglycol, glycerol, tetrahydrofuran, dioxane, methoxy-ethanol, methoxy-propanol, propylene glycol monomethyl ether (such as Dowanol PM), ethylene glycol monobutyl ether, ethylene glycol benzyl ether, ethylene glycol monophenyl ether, benzyl alcohol, methylphenylcarbinol, n-amyl alcohol and methylamyl alcohol; an alkyl-substituted aromatic hydrocarbon as xylene; and a halogenated hydrocarbon as methylene dichloride and monochlorobenzene. These organic solvents may be used alone or in combination, and optionally all of these organic solvents or mixture of organic solvents may also be used in combination with water.

In a preferred embodiment of this method of making a lithographic printing plate precursor, the coating solution as prepared in step 2) is filtered. In a more preferred embodiment, the coating solution is filtered by passing the solution through a filter with a pore size of less than 10 μm. The inventors of the present invention found that the quality of the coating of the photopolymerisable layer can be improved when the coating solution is filtered before coating the layer. In accordance with the present invention, the printing plate precursors prepared by this method are suitable for making a lithographic printing plate thereof by the method as defined above. These printing plates exhibit improved clean-out and no toning on printing.

In the present invention, the printing plate precursor is image-wise exposed by means of a plate setter, i.e. a laser exposure apparatus suitable for image-wise exposing a precursor. The precursor used in the method of the present invention is negative-working whereby at the exposed areas the coating is hardened. Here, "hardened" means that the coating is polymerized and/or crosslinked, thereby becoming insoluble or non-dispersible for the gum solution or the fountain and ink in the processing.

After imaging, the plate precursor is optionally heated, hereinafter also referred to as "pre-heat", to enhance or to speed-up the polymerization and/or crosslinking reaction. This pre-heat step is carried out preferably at a temperature of about 80° C. to 150° C. and preferably during a dwell time of about 5 seconds to 1 minute and preferably in a preheating unit provided with heating elements such as IR-lamps, UV-lamps, heated air, heated rolls, etc. In a preferred embodiment of the present invention, said precursor is not heated after the imaging step b) and before the processing step d).

Subsequently to the imaging step and the optional pre-heat step but preferably without the pre-heat step, the plate precursor is processed under mild processing conditions; this means whereby a solution having a pH of preferably at most 9, more preferably at most 8, most preferably at most 7 and having a pH of preferably at least 3, more preferably at least 4, most preferably at least 5 is used as processing solution. Such mild processing conditions are realised by preferably off-press processing with a gum solution or on-press processing with fountain and ink.

When processing with a gum solution, hereinafter also referred to as "gum-processing", the non-exposed areas of the coating are removed from the support to such an extent that no toning occurs during the printing process, and the hydrophilic surface of the support at the non-exposed areas is protected by adsorption of gumming agent. This gum-processing has the additional benefit that, due to the remaining gumming agent on the plate in the non-exposed areas, an additional gumming step is not required to protect the surface of the support in the non-exposed areas. As a result, the lithographic image will not be affected by ambient conditions or by working environment contaminations.

In accordance with a preferred embodiment of the present invention, said exposed precursor is processed in step d) by processing and gumming the precursor of step b) or c) by applying a gum solution and optionally brushing the precursor, thereby removing at least part of the coating at non-exposed areas and gumming the plate in one single step.

When processing on-press, the precursor is processed on the press, i.e. the precursor is mounted on the plate cylinder of a lithographic printing press, and the plate cylinder is rotated while dampening liquid and/or ink are fed to the coating of the precursor. This on-press processing process has the additional benefit that a separate developing step and an additional gumming step are replaced by starting the printing process and printing a few number of sheets.

In accordance with another preferred embodiment of the present invention, said exposed precursor is processed in step d) by mounting the exposed precursor on a plate cylinder of a lithographic printing press and rotating the plate cylinder while feeding dampening liquid and/or ink to the coating, thereby removing non-exposed areas of the coating.

The method of the present invention has the advantage that the clean-out is improved and that no toning is observed on the printed is sheets.

The method of the present invention has the additional advantage that a high run length is obtained. This means that 10000 or even 50000 printed sheets of high quality, i.e. high resolution images without toning, are obtained.

The Support

A particularly preferred lithographic support is an electrochemically grained and anodized aluminum support. Graining an anodizing of aluminum supports is well known. The acid used for graining can be e.g. nitric acid or sulfuric acid. The acid used for graining preferably comprises hydrogen chloride. Also mixtures of e.g. hydrogen chloride and acetic acid can be used. The relation between electrochemical graining and anodizing parameters such as electrode voltage, nature and concentration of the acid electrolyte or power consumption on the one hand and the obtained lithographic quality in terms of Ra and anodic weight (g/m$^2$ of $Al_2O_3$ formed on the aluminum surface) on the other hand is well known. More details about the relation between various production parameters and Ra or anodic weight can be found in e.g. the article "Management of Change in the Aluminium Printing Industry" by F. R. Mayers, published in the ATB Metallurgie Journal, volume 42 nr. 1-2 (2002) pag. 69.

In the EP-A 1 826 021 a characterizing method of the surface of a grained and anodized aluminum is disclosed. The parameter 'mean pith depth', calculated according to this characterizing method, correlates with the number and depth of the pits present at the aluminum surface. The mean pith depth of the aluminum surface is preferably less then 2.0 µm, more preferably less then 1.8 µm, most preferably less then 1.5 µm. The standard deviation of the 'mean pith depth' is preferably less then 0.70 µm, more preferably less then 0.50 µm, most preferably less then 0.35 µm.

The anodized aluminum support may be subject to a so-called post-anodic treatment to improve the hydrophilic properties of its surface. For example, the aluminum support may be silicated by is treating its surface with a sodium silicate solution. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde.

Another useful post-anodic treatment may be carried out with a solution of polyacrylic acid or a polymer comprising at least 30 mol % of acrylic acid monomeric units, e.g. GLASCOL E15, a polyacrylic acid, commercially available from ALLIED COLLOIDS.

In a preferred embodiment of the present invention, the grained and anodised aluminum support is not subjected to a so-called post-anodic treatment as defined above.

The grained and anodized aluminum support may be a sheet-like material such as a plate or it may be a cylindrical element such as a sleeve which can be slid around a print cylinder of a printing press.

The support can also be a metal support such as aluminum or stainless steel. The metal can also be laminated to a plastic layer, e.g. polyester film. Alternative supports for the plate precursor can also be used, such as amorphous metallic alloys (metallic glasses). Such amorphous metallic alloys can be used as such or joined with other non-amorphous metals such as aluminum. Examples of amorphous metallic alloys are described in U.S. Pat. No. 5,288,344, U.S. Pat. No. 5,368,659, U.S. Pat. No. 5,618,359, U.S. Pat. No. 5,735,975, U.S. Pat. No. 5,250,124, U.S. Pat. No. 5,032,196, U.S. Pat. No. 6,325,868, and U.S. Pat. No. 6,818,078, the disclosures of which are incorporated by reference. The following references describe the science of amorphous metals in much more detail and are incorporated as references: Introduction to the Theory of Amorphous Metals, N. P. Kovalenko et al (2001); Atomic Ordering in Liquid and Amorphous Metals, S. I. Popel, et al; Physics of Amorphous Metals, N. P. Kovalenko et al (2001). The metal surface can be grained and anodized as described above.

The support can also be a flexible support, which may be provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 µm and is preferably 1 to 10 µm. More details of preferred embodiments of the base layer can be found in e.g. EP-A 1 025 992.

The Coating

The coating comprises a layer, contiguous to the support, wherein (1) an adhesion promoting compound which is a non-polymeric compound containing a group having an ethylenically unsaturated bond and a group capable of interacting with the support selected from a phosphate group, a phosphonate group and a trialkoxysilane group, and (2) a second polymer having at least 1 mol % of a first monomeric unit having a group capable of interacting with the support such as a phosphate group, a phosphonate group, a carboxylic acid group, a sulphonic acid group, a phenolic group, a so trialkoxysilane group, an ammonium group or a phosphonium group and at least 30 mol % of a second monomeric unit having a hydrophilic group, both together are present in that layer. Said contiguous layer is (a) a photopolymerizable layer having a photopolymerisable composition, or (b) an intermediate layer and thereon a photopolymerizable layer having a photopolymerisable composition.

The Adhesion Promoting Compound

The adhesion promoting compound is a non-polymeric compound which contains a group having an ethylenically unsaturated bond and a group capable of interacting with the support selected from a phosphate group, a phosphonate group and a trialkoxysilane group. Said adhesion promoting compound is not a polymeric compound, this means that, when said functional group capable of interacting with the support is part of a recurring monomeric unit, not more than 4 of said monomeric units are present in the compound. In a preferred embodiment, the compound comprises not more than 3 of said monomeric units, more preferably not more than 2 of said monomeric units, most preferably the compound comprises only one of said monomeric unit.

Under "interacting" is understood each type of physical and/or chemical reaction or process whereby, between the functional group and the support, a bond is formed which can be a covalent bond, an ionic bond, a complex bond, a coordinate bond or a hydrogen-bridge bond, and which can be formed by an adsorption process, a chemical reaction, an acid-base reaction, a complex-forming reaction or a reaction of a chelating group or a ligand.

Examples of adhesion promoting compounds according to the present invention are disclosed in EP-A 851 299 from lines 22 on page 3 to line 1 on page 4, EP-A 1 500 498 from paragraph [0023] on page 7 to paragraph [0052] on page 20, EP-A 1 495 866 paragraph [0030] on page 5 to paragraph [0049] on page 11, EP-A 1 091 251 from paragraph [0014] on page 3 to paragraph [0018] on page 20, and EP-A 1 520 694 from paragraph [0023] on page 6 to paragraph [0060] on page 19.

Preferred adhesion promoting compounds are those compounds which comprise a phosphate or phosphonate group as functional group capable of adsorbing on the grained and anodized aluminium support, optionally provided with a post-anodic treatment, and which comprise an addition-polymerisable ethylenic double bond reactive group. Such compounds are preferably selected from those compounds described in EP-A 851 299 from lines 22 on page 3 to line 1 on page 4 and EP-A 1 500 498 from paragraph [0023] on page 7 to paragraph [0052] on page 20.

In another preferred embodiment, said functional group is capable of interacting with a grained and anodised aluminium support, optionally provided with a post-anodic treatment, but preferably not provided with a post-anodic treatment.

Highly preferred groups containing ethylenically unsaturated bonds are (meth)acrylate groups.

Highly preferred adhesion promoting compounds are selected from at least one of the following compounds: (oligo)ethyleneoxy(meth)acrylate phosphate such as Sipomer PAM100, ethyleneglycol methacrylate phosphate, alkyl (meth)acrylate phosphonate, (oligo)ethyleneoxy(meth)acrylate phosphonate, trialkoxysilane alkyl(meth)acrylate, and salts thereof, and each of these monomers being optionally substituted.

The Second Polymer

The second polymer, hereinafter also referred to as "hydrophilic polymer", is a polymer having at least 1 mol % of a first monomeric unit having a group capable of interacting with the support such as a phosphate group, a phosphonate group, a carboxylic acid group, a sulphonic acid group, a phenolic group, a trialkoxysilane group, an ammonium group or a phosphonium group and at least 30 mol % of a second monomeric unit having a hydrophilic group. Said phosphate, phosphonate, carboxylic acid, sulphonic acid, phenolic, trialkoxysilane, ammonium or phosphonium group of said first monomeric unit are functional groups, preferably capable of interacting with the support, more preferably capable of interacting with a grained and anodised aluminium support, optionally provided with a post-anodic treatment, but preferably not provided with a post-anodic treatment. Under "interacting" is understood each type of physical and/or chemical reaction or process whereby, between the functional group and the support, a bond is formed which can be a covalent bond, an ionic bond, a complex bond, a coordinate bond or a hydrogen-bridge bond, and which can be formed by an adsorption process, a chemical reaction, an acid-base reaction, a complex-forming reaction or a reaction of a chelating group or a ligand.

Preferred functional groups of the first monomeric unit are a phosphate group, a phosphonate group, a carboxylic acid group, a sulphonic acid group, a phenolic group or a trialkoxysilane group, more preferred are a phosphate group, a phosphonate group, a carboxylic acid group or a sulphonic acid group, most preferred are a phosphate group or a carboxylic acid group.

Preferred first monomeric units are selected from at least one of the following monomers:
vinyl phosphonic acid, sulphoethyl(meth)acrylate, sulphopropyl(meth)acrylate, sulphobutyl(meth)acrylate, (meth)acrylamido-2-propane-sulphonic acid, vinylsulphonic acid, styrene sulphonic acid, (meth)acrylic acid, maleic acid, crotonic acid, itaconic acid, vinyl benzoic acid, vinyl phenyl acetic acid, vinyl phenol, 4-hydroxy styrene, 4-vinylbenzyl phosphonic acid, (oligo)ethyleneoxy(meth)acrylate phosphate, alkyl(meth)acrylate phosphate, (oligo)ethyleneoxy(meth)acrylate phosphonate, trialkoxysilane alkyl(meth)acrylate, quaternised amino ethyl(meth)acrylate, quaternised amino propyl(meth)acrylamide and quaternised vinyl pyridine, and salts thereof, and each of these monomers being optionally substituted. More preferred monomeric units capable of interacting with the support are vinyl phosphonic acid, sulphoethyl(meth)acrylate, styrene sulphonic acid, (oligo)ethyleneoxy(meth)acrylate phosphate, (oligo)ethyleneoxy(meth)acrylate phosphonate and trialkoxysilane alkyl(meth)acrylate, and salts thereof, and each of these monomers being optionally substituted. Most preferred monomeric units capable of interacting with the support are vinyl phosphonic acid, (meth)acrylic acid, (oligo)ethyleneoxy(meth)acrylate phosphate, (oligo)ethyleneoxy(meth)acrylate phosphonate and trialkoxysilane so alkyl(meth)acrylate, and salts thereof, and each of these monomers being optionally substituted.

Said hydrophilic group of the second monomeric unit preferably comprises at least one of the groups selected from the list consisting of a carboxylic group, a sulphonic group, an alcohol group, a phenolic group, a hydroxyalkyl group, a ethyleneoxy group, a propyleneoxy group, an amide group, a sulphonamide group, a pyrrolidone group, an ammonium and a phosphonium group.

Preferred second monomeric units are selected from at least one of the following monomers: (meth)acrylic acid, maleic acid, crotonic acid, itaconic acid, vinyl benzoic acid, vinyl phenyl acetic acid, sulphoethyl(meth)acrylate, sulphopropyl(meth)acrylate, sulphobutyl(meth)acrylate, (meth)acrylamido-2-propane-sulphonic acid, vinylsulphonic acid, styrene sulphonic acid, vinyl phenol, 4-hydroxy styrene, ethyleneoxide, propyleneoxide, methylvinylether, vinyl alcohol, hydrolysed vinylacetate, maleic anhydride or maleimide grafted with poly(ethyleneoxide) group having at least 2 ethyleneoxide groups, N-vinylpirrolidone, N-vinylcaprolactam, (meth)acrylamide, N-methylol(meth)acrylamide, N-methyl (meth)acrylamide, N-ethyl(meth)acrylamide, N-isopropyl (meth)acrylamide, 2-(dimethylamino)ethyl(meth)acrylate, hydroxyethyl(meth)acrylate, quaternised amino ethyl(meth) acrylate, quaternised amino propyl(meth)acrylamide and quaternised vinyl pyridine, and salts thereof, and each of these monomers being optionally substituted. More preferred second monomeric units are sulphoethyl(meth)acrylate, styrene sulphonic acid, vinyl alcohol, (meth)acrylic acid, maleic acid, crotonic acid, itaconic acid, (meth)acrylamide, N-methylol(meth)acrylamide, N-vinylpirrolidone and ethyleneoxide, and salts thereof, and each of these monomers being optionally substituted. Most preferred second monomeric units are (meth)acrylic acid, maleic acid, crotonic acid, itaconic acid, vinyl alcohol and ethyleneoxide, and salts thereof, and each of these monomers being optionally substituted.

According to the present invention, said second polymer comprises said first monomeric unit in an amount of at least 1 mol %, preferably in an amount between 1 and 70 mol %, more preferably between 5 and 70 mol %, most preferably between 10 and 70 mol %.

According to the present invention, said second polymer comprises said second monomeric unit in an amount of at least 30 mol %, preferably in an amount ranging between 40 and 99 mol %, more preferably between 50 and 95 mol %, most preferably between 60 and 90 mol %.

When the contiguous layer is a photopolymerizable layer, the adhesion promoting compound and the second polymer are both together present in the photopolymerizable layer. The adhesion promoting compound is present in an amount ranging preferably between 1 and 50 wt %, more preferably between 3 and 30 wt %, most preferably between 5 and 20 wt % of the non-volatile components of the composition. The second polymer is present in an amount less than 5% by weight, preferably less than 4 wt %, most preferably less than 3 wt %, and the minimum amount of this polymer is at least 0.01 wt %, preferably at least 0.05 wt %, more preferably at least 0.1 wt % of the non-volatile components of the composition. In the present invention, the amount of the adhesion promoting compound is higher than the amount of the second polymer. The weight ratio of the amount of adhesion promoting compound to the amount of the second polymer is preferably between 50:1 and 2:1, more preferably between 40:1 and 5:1. This photopolymerizable layer has a coating thickness preferably ranging between 0.1 and 5.0 g/m$^2$, more preferably between 0.3 and 3.0 g/m$^2$, most preferably between 0.4 and 1.5 g/m$^2$.

When the contiguous layer is an intermediate layer, the adhesion promoting compound and the second polymer are both together present in the intermediate layer. The adhesion promoting compound is present in an amount ranging preferably between 10 and 99 wt %, more preferably between 30 and 95 wt %, most preferably between 60 and 90 wt % of the non-volatile components of the composition. The second polymer is present in an amount ranging preferably between 1 and 90 wt %, more preferably between 5 and 70 wt %, most preferably between 10 and 40 wt % of the non-volatile components of the composition. In the present invention, the amount of the adhesion promoting compound is higher than the amount of the second polymer. The weight ratio of the amount of adhesion promoting compound to the amount of the second polymer is preferably less than 20:1, more preferably between 15:1 and 1.5:1, most preferably between 10:1 and is 2:1. This intermediate layer has a coating thickness preferably ranging between 0.001 and 1.5 g/m$^2$, more preferably between 0.005 and 0.5 g/m$^2$, most preferably between 0.01 and 0.2 g/m$^2$. The photopolymerizable layer on this intermediate layer has a coating thickness preferably ranging between 0.1 and 5.0 g/m$^2$, more preferably between 0.3 and 3.0 g/m$^2$, most preferably between 0.4 and 1.5 g/m$^2$.

The Photopolymerizable Layer

The coating on the support comprises at least one layer comprising a photopolymerizable composition, said layer hereinafter also referred to as "photopolymerizable layer". This photopolymerizable layer may be the contiguous layer or this photopolymerizable layer is present on an intermediate layer which is the contiguous layer.

The coating may further comprise an oxygen-barrier layer, which comprises a water-soluble or water-swellable polymer, on said photopolymerizable layer, said oxygen-barrier layer hereinafter also referred to as "toplayer" or "overcoat" or "overcoat layer".

The photopolymerizable layer comprises a polymerizable compound, a polymerization initiator capable of hardening said polymerizable compound in the exposed areas and a first polymer as binder and, when this layer is the contiguous layer, this layer further comprises an adhesion promoting compound and a second polymer in accordance with the present invention as described above.

The Polymerizable Compound and the Polymerization Initiator

The polymerizable compound may be a polymerizable monomer or oligomer comprising at least one epoxy or vinyl ether functional group. The initiator can be a Bronsted acid generator capable of generating free acid, optionally in the presence of a sensitizer, upon exposure, hereinafter said initiator also referred to as "cationic photoinitiator" or "cationic initiator".

Suitable polyfunctional epoxy monomers include, for example, 3,4-epoxycyclohexylmethyl-3,4-epoxycyclohexane carboxylate, bis-(3,4-epoxycyclohexymethyl)adipate, difunctional bisphenol Aepichlorohydrin epoxy resin and multifunctional epichlorohydrinitetraphenylol ethane epoxy resin.

Suitable cationic photoinitiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating Bronsted acid, they also generate free radicals during photo or thermal decomposition.

The polymerizable monomer or oligomer may be an ethylenically unsaturated compound, having at least one terminal ethylenic group, hereinafter also referred to as "free-radical polymerizable monomer".

In accordance with the present invention, this polymerizable monomer or oligomer is different from the non-polymeric compound which contains a group having an ethylenic unsaturated bond and a group capable of interacting with the support selected from a phosphate, a phosphonate and a trialkoxysilane group.

Said initiator is a compound, capable of generating free radicals, optionally in the presence of a sensitizer, upon exposure, hereinafter said initiator also referred to as "free radical initiator".

Suitable free-radical polymerizable monomers may include, for example, multifunctional (meth)acrylate monomers (such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate), and oligomeric amine diacrylates. The (meth)acrylic monomers may also have other double bond or epoxide group, in addition to (meth)acrylate group. The (meth)acrylate monomers may also contain an acidic (such as carboxylic acid) or basic (such as amine) functionality.

Any free radical initiator capable of generating free radical directly or in the presence of a sensitizer upon exposure can be used as a free radical initiator of this invention. Suitable free-radical initiators include, for example, the derivatives of acetophenone (such as 2,2-dimethoxy-2-phenylacetophenone, and 2-methyl-1-[4-(methylthio)phenyl-2-morpholino propan-1-one); benzophenone; benzil; ketocoumarin (such as 3-benzoyl-7-methoxy coumarin and 7-methoxy coumarin); xanthone; thioxanthone; benzoin or an alkyl-substituted anthraquinone; onium salts (such as diaryliodonium hexafluoroantimonate, diaryliodonium triflate, (4-(2-hydroxytetradecyl-oxy)-phenyl) phenyliodonium hexafluoroantimonate, triarylsulfonium hexafluorophosphate, triarylsulfonium p-toluenesulfonate, (3-phenylpropan-2-onyl)triaryl phosphonium hexafluoroantimonate, and N-ethoxy(2-methyl)pyridinium hexafluorophosphate, and onium salts as described in U.S. Pat. Nos. 5,955,238, 6,037,098, and 5,629,354); borate salts (such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and borate salts as described in U.S. Pat. Nos. 6,232,038 and 6,218,076,); haloalkyl substituted s-triazines (such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxy-ethyleneoxy)-phen-1-yl]-s-triazine, and s-triazines as described in U.S. Pat. Nos. 5,955,238, 6,037,098, 6,010,824 and 5,629,354); and titanocene (bis(etha.9-2,4-cyclopentadien-1-yl)bis[2,6-difluoro-3-(1H-pyrrol-1-yl)phenyl)titanium). Onium salts, borate salts, and s-triazines are preferred free radical initiators. Diaryliodonium salts and triarylsulfonium salts are preferred onium salts. Triarylalkylborate salts are preferred borate salts. Trichloromethyl substituted s-triazines are preferred s-triazines.

The known photopolymerization initiators can be used in the composition of the present invention, in a preferred embodiment of the present invention the photopolymerizable composition according to the present invention comprises a hexaaryl-bisimidazole (HABI; dimer of triaryl-imidazole) compound as a photopolymerization initiator alone or in combination with further photoinitiators.

A procedure for the preparation of hexaarylbisimidazoles is described in DE 1470 154 and their use in photopolymerizable compositions is documented in EP 24 629, EP 107 792, U.S. Pat. No. 4,410,621, EP 215 453 and DE 3 211 312. Preferred derivatives are e.g. 2,4,5,2',4',5'-hexaphenylbisimidazole, 2,2'-bis(2-chlorophenyl)-4,5,4',5'-tetraphenylbisimidazole, 2,2'-bis(2-bromophenyl)-4,5,4',5'-tetraphenylbisimidazole, 2,2'-bis(2,4-dichlorophenyl)-4,5,4',5'-tetraphenylbisimidazole, 2,2'-bis(2-chlorophenyl)-4,5,4',5'-tetrakis(3-methoxyphenyl)bisimidazole, 2,2'-bis(2-chlorophenyl)-4,5,4',5'-tetrakis(3,4,5-trimethoxyphenyl)-bisimidazole, 2,5,2',5'-tetrakis(2-chlorophenyl)-4,4'-bis(3,4-dimethoxyphenyl)bisimidazole, 2,2'-bis(2,6-dichlorophenyl)-4,5,4',5'-tetraphenylbisimidazole, 2,2'-bis(2-nitrophenyl)-4,5,4',5'-tetraphenylbisimidazole, 2,2'-di-o-tolyl-4,5,4',5'-tetraphenylbisimidazole, 2,2'-bis(2-ethoxyphenyl)-4,5,4',5'-tetraphenylbisimidazole and 2,2'-bis(2,6-difluorophenyl)-4,5,4',5'-tetraphenylbisimidazole. The amount of the HABI photoinitiator typically ranges from 0.01 to 30 by weight, preferably from 0.5 to by weight, relative to the total weight of the non volatile components of the photopolymerizable composition.

A very high sensitivity can be obtained in the context of the present invention by the combination of an optical brightener as sensitizer and a hexaarylbisimidazole as photoinitiator.

Suitable classes of photoinitiators other than hexaarylbisimidazole compounds include aromatic ketones, aromatic onium salts, organic peroxides, thio compounds, ketooxime ester compounds, borate compounds, azinium compounds, metallocene compounds, active ester compounds and compounds having a carbon-halogen bond, but preferably the composition comprises a non-boron comprising photopolymerization initiator and particularly preferred the photopolymerization initiator comprises no boron compound. Many specific examples of photoinitiators suitable for the present invention can be found in EP-A 1 091 247. Other preferred initiators are trihalomethyl aryl sulphones.

Preferably hexaarylbisimidazole compounds and/or metallocene compounds and/or trihalomethyl aryl sulphone compounds are used alone or in combination with other suitable photoinitiators, in particular with aromatic ketones, aromatic onium salts, organic peroxides, thio compounds, ketoxime ester compounds, azinium compounds, active ester compounds or compounds having a carbon halogen bond.

In a preferred embodiment of the present invention, the hexaarylbisimidazole or trihalomethyl aryl sulphone compounds make more than 50 mol-%, preferably at least 80 mol-% and particularly preferred at least 90 mol-% of all the photoinitiators used in the photopolymerizable composition of the present invention.

The polymerizable monomer or oligomer may be a combination of a monomer or oligomer comprising at least one epoxy or vinyl ether functional group and a polymerizable ethylenically unsaturated compound, having at least one terminal ethylenic group, and said initiator may be a combination of a cationic initiator and a free-radical initiator. A monomer or oligomer comprising at least one epoxy or vinyl ether functional group and a polymerizable ethylenically unsaturated compound, having at least one terminal ethylenic group, can be the same compound wherein the compound contains both ethylenic group and epoxy or vinyl ether group. Examples of such compounds include epoxy functional acrylic monomers, such as glycidyl acrylate. The free radical initiator and the cationic initiator can be the same compound if the compound is capable of generating both free radical and free acid. Examples of such compounds include various onium salts such as diaryliodonium hexafluoroantimonate and s-triazines such as 2,4-bis(trichloromethyl)-6-[(4-ethoxyethylenoxy)-phen-1-yl]-s-triazine which are capable of generating both free radical and free acid in the presence of a sensitizer.

The photopolymerizable layer may also comprise a multifunctional monomer. This monomer contains at least two functional groups selected from an ethylenically unsaturated group and/or an epoxy or vinyl ether group. Particular multifunctional monomers for use in the photopolymer coating are disclosed in U.S. Pat. No. 6,410,205, U.S. Pat. No. 5,049,479, EP 1079276, EP 1369232, EP 1369231 EP 1341040, US 2003/0124460, EP 1241002, EP 1288720 and in the reference book including the cited references: Chemistry & Technology UV & EB formulation for coatings, inks & paints—Volume 2—Prepolymers and Reactive Diluents for UV and EB Curable Formulations by N. S. Allen, M. A. Johnson, P. K. T. Oldring, M. S. Salim—Edited by P. K. T. Oldring—1991—ISBN 0 947798102. Particularly preferred are urethane (meth)acrylate multifunctional monomers, which can be used alone or in combination with other (meth)acrylate multifunctional monomers. The functionality of these monomers is preferably 2 to 6 (meth)acrylate groups per monomer molecule. Mixtures of multifunctional monomers with different functionality can be used to obtain improved plate characteristics.

The photopolymerizable layer may also comprise a co-initiator. Typically, a co-initiator is used in combination with a free radical initiator and/or cationic initiator. Particular co-initiators for use in the photopolymer coating are disclosed in U.S. Pat. No. 6,410,205, U.S. Pat. No. 5,049,479, EP 1079276, 1369232, EP 1369231 EP 1341040, US 2003/0124460, EP 1241002, EP 1288720 and in the reference book including the cited references: Chemistry & Technology UV & EB formulation for coatings, inks & paints—Volume 3—Photoinitiators for Free Radical and Cationic Polymerisation by K. K. Dietliker—Edited by P. K. T. Oldring—1991—ISBN 0 947798161.

The photopolymerizable layer may also comprise an inhibitor. Particular inhibitors for use in the photopolymer coating are disclosed in U.S. Pat. No. 6,410,205, EP 1288720 and the unpublished patent application EP-A 04101955, filed on Jun. 5, 2004.

First Polymer as Binder of the Photopolymerizable Layer

A first polymer is present as binder in the photopolymerizable layer. This first polymer can be selected from a wide series of organic polymers. Compositions of different first polymers can also be used. Useful first polymers include for example chlorinated polyalkylene (in particular chlorinated polyethylene and chlorinated polypropylene), polymethacrylic acid alkyl esters or alkenyl esters (in particular polymethyl(meth)acrylate, polyethyl(meth)acrylate, polybutyl(meth)acrylate, polyisobutyl(meth)acrylate, polyhexyl (meth)acrylate, poly(2-ethylhexyl)(meth)acrylate and polyalkyl(meth)acrylate copolymers of (meth)acrylic acid alkyl esters or alkenyl esters with other copolymerizable monomers (in particular with (met)acrylonitrile, vinyl chloride, vinylidene chloride, styrene and/or butadiene), polyvinyl chloride (PVC, vinylchloride/(meth)acrylonitrile copolymers, polyvinylidene chloride (PVDC), vinylidene chloride/(meth)acrylonitrile copolymers, polyvinyl acetate, polyvinyl alcohol, polyvinyl pyrrolidone, copolymers of vinyl pyrrolidone or alkylated vinyl pyrrolidone, polyvinyl caprolactam, copolymers of vinyl caprolactam, poly(meth)acrylonitrile, (meth)acrylonitrile/styrene copolymers, (meth)acrylamide/alkyl(meth)acrylate copolymers, (meth)acrylonitrile/butadiene/styrene (ABS) terpolymers, polystyrene, poly(α-methyl-styrene), polyamides, polyurethanes, polyesters, methyl cellulose, ethylcellulose, acetyl cellulose, hydroxy-($C_1$-$C_4$-alkyl)cellulose, carboxymethyl cellulose, polyvinyl formal and polyvinyl butyral. Particularly preferred first polymers are polymers having vinylcaprolactam, vinylpyrrolidone or alkylated vinylpyrrolidone as monomeric units. Alkylated vinylpyrrolidone polymers can be obtained by grafting alfa-olefines onto the vinylpyrrolidone polymer backbone. Typical examples of such products are the Agrimer AL Graft polymers commercially available from ISP. The length of the alkylation group may vary from $O_4$ to $O_{30}$. Other useful first polymers are polymers containing carboxyl groups, in particular copolymers containing monomeric units of α,β-unsaturated carboxylic acids or monomeric units of α,β-unsaturated dicarboxylic acids (preferably acrylic acid, methacrylic acid, crotonic acid, vinylacetic acid, maleic acid or itaconic acid). By the term "copolymers" are to be understood in the context of the present invention as polymers containing units of at least 2 different monomers, thus also terpolymers and higher mixed polymers. Particular examples of useful copolymers are those containing units of (meth)acrylic acid and units of alkyl(meth)acrylates, allyl(meth)acrylates and/or (meth)acrylonitrile as well as copolymers containing units of crotonic acid and units of alkyl(meth)acrylates and/or (meth) acrylonitrile and vinylacetic acid/alkyl(meth)acrylate copolymers. Also suitable are copolymers containing units of maleic anhydride or maleic acid monoalkyl esters. Among these are, for example, copolymers containing units of maleic anhydride and styrene, unsaturated ethers or esters or unsaturated aliphatic hydrocarbons and the esterification products obtained from such copolymers. Further suitable first polymers are products obtainable from the conversion of hydroxyl-containing polymers with intramolecular dicarboxylic anhydrides. Further useful first polymers are polymers in which groups with acid hydrogen atoms are present, some or all of which are converted with activated isocyanates. Examples of these first polymers are products obtained by conversion of hydroxyl-containing polymers with aliphatic or aromatic sulfonyl isocyanates or phosphinic acid isocyanates. Also suitable as first polymers are polymers with aliphatic or aromatic hydroxyl groups, for example copolymers containing units of hydroxyalkyl(meth)acrylates, allyl alcohol, hydroxystyrene or vinyl alcohol, as well as epoxy resins, provided they carry a sufficient number of free OH groups. Particular useful as first polymers are polymers and particular reactive polymers as disclosed in EP 1 369 232, EP 1 369 231, EP 1 341 040, US 2003/0124460, EP 1 241 002, EP 1 288 720, U.S. Pat. No. 6,027,857, U.S. Pat. No. 6,171,735 and U.S. Pat. No. 6,420,089.

The organic polymers used as first polymers have a typical mean molecular weight $M_w$ between 600 and 700 000, preferably between 1 000 and 350 000. Preference is further given to first polymers having an acid number between 10 to 250, preferably 20 to 200, or a hydroxyl number between 50 and 750, preferably between 100 and 500. The amount of first polymer(s) generally ranges from 10 to 90% by weight, preferably 20 to 80% by weight, relative to the total weight of the non-volatile components of the composition.

Also particular suitable first polymers are copolymers of vinylacetate and vinylalcohol, preferably comprising vinylalcohol in an amount of 10 to 98 mol % vinylalcohol, more preferably between 35 and 95 mol %, most preferably 40 and 75 mol %, best results are obtained with 50 to 65 mol % vinylalcohol. The ester-value, measured by the method as defined in DIN 53 401, of the copolymers of vinylacetate and vinylalcohol ranges preferably between 25 and 700 mg KOH/g, more preferably between 50 and 500 mg KOH/g, most preferably between 100 and 300 mg KOH/g. The viscosity of the copolymers of vinylacetate and vinylalcohol are measured on a 4 weight % aqueous solution at 20° C. as defined in DIN 53 015 and the viscosity ranges preferably between 3 and 60 mPa·s, more preferably between 4 and 30 mPa·s, most preferably between 5 and 25 mPa·s. The average molecular weight $M_W$ of the copolymers of vinylacetate and vinylalcohol ranges preferably between 5 000 and 500 000 g/mol, more preferably between 10 000 and 400 000 g/mol, most preferably between 15 000 and 250 000 g/mol. Other preferred first polymers are disclosed in EP 152 819 B1 on page 2 lines 50-page 4 line 20, and in EP 1 043 627 B1 on paragraph [0013] on page 3.

The first polymers may also comprise a hydrophobic backbone, and pendant groups including for example a hydrophilic poly(alkylene oxide) segment. The first polymers may also include pendant cyano groups attached to the hydrophobic backbone. A combination of such first polymers may also be employed. Generally the first polymer may be a solid at room temperature, and may be typically a non-elastomeric thermoplastic. The first polymer comprises both hydrophilic and hydrophobic regions, which is thought to be important for enhancing differentiation of the exposed and unexposed areas by facilitating developability. Generally the first polymer is characterized by a number average molecular weight (Mn) in the range from about 10.000 to 250.000, more commonly in the range from about 25.000 to 200.000.

The polymerizable composition may also comprise discrete particles of a polymer. Preferably the discrete particles are particles of the polymer which are suspended in the polymerizable composition. The presence of discrete particles tends to promote developability of the unexposed areas. Specific examples of the polymeric binders according to this embodiment are described in U.S. Pat. No. 6,899,994, 2004/0260050, US2005/0003285, US2005/0170286 and US2005/0123853.

In addition to the first polymer of this embodiment the imageable layer may optionally comprise one or more co-binders. Typical co-binders are water-soluble or water-dispersible polymers, such as, cellulose derivatives, poly vinyl alcohol, poly acrylic acid poly(meth)acrylic acid, poly vinyl pyrrolidone, polylactide, poly vinyl phosphonic acid, synthetic co-polymers, such as the co-polymer of an alkoxy polyethylene glycol(meth)acrylate. Specific examples of co-binders are described in US2004/0260050, US2005/0003285 and US2005/0123853. Printing plate precursors, the imageable layer of which comprises a first polymer and optionally a co-binder according this embodiment and described in more detail in US2004/0260050, US2005/0003285 and US2005/0123853, optionally comprises a topcoat and an interlayer.

Another highly preferred suitable first polymer is a polymer which contains an acid group and a basic nitrogen-containing compound capable of neutralizing said acid group or a polymer which contains an acid group which is neutralised with a basic nitrogen-containing compound. Said basic nitrogen-containing compound has preferably an amino group, an amidine group or a guanidine group. Said amino group is preferably a tertiary amino group. In another preferred embodiment, said basic nitrogen-containing compound further comprises a group having an ethylenically unsaturated bond. Said group having an ethylenically unsaturated bond is most preferably a vinyl group or a (meth)acrylate group. Examples of basic nitrogen-containing compounds are
N,N-dimethyl amino ethyl(meth)acrylate,
N,N-dimethyl amino propyl(meth)acrylate,
N,N-diethyl amino propyl(meth)acrylate,
N,N-diethyl amino ethyl(meth)acrylate,
N,N-diethyl amino propyl(meth)acrylamide,
N,N-dimethyl amino ethyl-N'-(meth)acryloyl carbamate,
N,N-diethyl amino-ethoxyethyl(meth)acrylate,
t-butyl amino ethyl(meth)acrylate,
N,N-diethyl amino ethanol,
N,N-dimethyl aniline,
N,N-dimethyl amino ethoxy ethanol,
2-amino-2-ethyl-1,3-propanediol,
tetra(hydroxy ethyl)ethylene diamine,
tetramethyl hexane diamine,
tetramethyl butane diamine,
triethanol amine,
triethyl amine,
2-N-morphorino ethanol,
2-piperidino ethanol,
N-methyl amino ethanol,
N,N-dimethyl amino ethanol,
N-ethyl amino ethanol,
N,N,N-buthyl amino diethanol,
N,N-dimethyl amino ethoxy ethanol,
N,N-diethyl amino ethoxy ethanol,
N,ethanol amine,
N,N-diethanol amine,
N,N,N-triethanol amine,
N-methyl diethanol amine,
N,N,N-tri-isopropanol amine,
N,N-dimethyl dihydroxypropyl amine,
N,N-diethyl dihydroxypropyl amine,
N-methyl-glucamine,
piperazine,
Methylpiperazine,
N-hydroxyethylpiperazine,
N-hydroxyethylpiperazine,
N,N-dihydroxyethylpiperazine or
N-hydroxyethylpiperidine.

Of these nitrogen-containing compounds less volatile compounds are preferred to avoid odor nuisance. Said polymer which contains an acid group is a polymer which comprises a monomeric unit having in the side chain an acid group. Said acid group is preferably a carboxylic acid group, a sulphonic acid group, an imide group or a primary (i.e. —$SO_2$—$NH_2$) or secondary (i.e. —$SO_2$—NH—) sulphonamide group. Said polymer which contains an acid group is preferably a polymer or copolymer of (meth)acrylic acid, maleic acid, itaconic acid or a (meth)acryl amide.

The basic nitrogen-containing compound may be added previously to the polymer which contains an acid group whereby the acid group is neutralised by the basic nitrogen-containing compound, resulting in the formation of a salt of the acid and the base, and this polymer is added to the solution for coating the photopolymerizable layer. In the salt formation the acid and the base are mainly ionically bond to each other. In an alternative way, the polymer which contains an acid group and the basic nitrogen-containing compound may be both added to the solution for coating the photopolymerizable layer. The ratio of the amount of basic nitrogen-containing compound to the amount of acid groups present in the polymer may vary from 1 to 100 mol %, preferably from 5 to 100 mol %, more preferably from 10 to 100 mol %, most preferably from 20 to 100%. In another embodiment, said polymer which contains an acid group is not neutralised by a basic group.

Surfactant

Various surfactants may be added into the photopolymerizable layer to allow or enhance the developability of the precursor in the processing with a gum solution or with fountain and ink. Both polymeric and small molecule surfactants can be used. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added in an amount ranging between 0.1 and 30% by weight of the coating, more preferably between 0.5 and 20%, and most preferably between 1 and 15%.

Sensitizer

The photopolymerizable composition may also comprise a sensitizer. Highly preferred sensitizers are violet light absorbing sensitizers, having a maximum in the absorption spectrum between 350 nm and 450 nm, preferably between 370 nm and 420 nm, more preferably between 390 nm and 415 nm. Particular preferred sensitizers are disclosed in EP 1 349 006 paragraph [0007] to [0009], EP-A-3103499, filed on Sep. 22, 2003, and WO2004/047930, including the cited references in these patent applications. Other highly preferred sensitizers are infrared light absorbing dyes, having an absorption spectrum between 750 nm and 1300 nm, preferably between 780 nm and 1200 nm, more preferably between 800 nm and 1100 nm. Particular preferred sensitizers are heptamethinecyane dyes, especially the dyes disclosed in EP 1 359 008 paragraph [0030] to [0032]. Other preferred sensitizers are blue, green or red light absorbing sensitizers, having an absorption spectrum between 450 nm and 750 nm. Useful sensitizers can be selected from the sensitizing dyes disclosed in U.S. Pat. No. 6,410,205, U.S. Pat. No. 5,049,479, EP 1 079 276, EP 1 369 232, EP 1 369 231, EP 1 341 040, US 2003/0124460, EP 1 241 002 and EP 1 288 720.

Colorant

The photopolymerizable layer or another layer of the coating may also comprise a colorant. The colorant can be present in the photopolymerizable layer or in a separate layer below or above the photopolymerizable layer. After processing, at least part of the colorant remains on the hardened coating areas, and a visible image can be produced on the support by removing the coating, including the colorant, at the non-exposed areas in the processing. This formation of a visible image can be advantageous when the precursor is off-press processed with a gum solution.

The colorant can be a dye or a pigment. A dye or pigment can be used as a colorant when the layer, comprising the dye or pigment, is colored for the human eye.

The colorant can be a pigment. Various types of pigments can be used such as organic pigments, inorganic pigments, carbon black, metallic powder pigments and fluorescent pigments. Organic pigments are preferred.

Specific examples of organic pigments include quinacridone pigments, quinacridonequinone pigments, dioxazine pigments, phthalocyanine pigments, anthrapyrimidine pigments, anthanthrone pigments, indanthrone pigments, flavanthrone pigments, perylene pigments, diketopyrrolopyrrole pigments, perinone pigments, quinophthalone pigments, anthraquinone pigments, thioindigo pigments, benzimidazolone pigments, isoindolinone pigments, azomethine pigments, and azo pigments.

Specific examples of pigments usable as colorant are the following (herein is C.I. an abbreviation for Color Index; under a Blue colored pigment is understood a pigment that appears blue for the human eye; the other colored pigments have to be understood in an analogue way):

Blue colored pigments which include C.I. Pigment Blue 1, C.I. Pigment Blue 2, C.I. Pigment Blue 3, C.I. Pigment Blue 15:3, C.I. Pigment Blue 15:4, C.I. Pigment Blue 15:34, C.I. Pigment Blue 16, C.I. Pigment Blue 22, C.I. Pigment Blue 60 and the like; and C.I. Vat Blue 4, C.I. Vat Blue 60 and the like;

Red colored pigments which include C.I. Pigment Red 5, C.I. Pigment Red 7, C.I. Pigment Red 12, C.I. Pigment Red 48 (Ca), C.I. Pigment Red 48 (Mn), C.I. Pigment Red 57 (Ca), C.I. Pigment Red 57:1, C.I. Pigment Red 112, C.I. Pigment Red 122, C.I. Pigment Red 123, C.I. Pigment Red 168, C.I. Pigment Red 184, C.I. Pigment Red 202, and C.I. Pigment Red 209;

Yellow colored pigments which include C.I. Pigment Yellow 1, C.I. Pigment Yellow 2, C.I. Pigment Yellow 3, C.I. Pigment Yellow 12, C.I. Pigment Yellow 13, C.I. Pigment Yellow 14C, C.I. Pigment Yellow 16, C.I. Pigment Yellow 17, C.I. Pigment Yellow 73, C.I. Pigment Yellow 74, C.I. Pigment Yellow 75, C.I. Pigment Yellow 83, C.I. Pigment Yellow 93, C.I. Pigment Yellow 95, C.I. Pigment Yellow 97, C.I. Pigment Yellow 98, C.I. Pigment Yellow 109, C.I. Pigment Yellow 110, C.I. Pigment Yellow 114, C.I. Pigment Yellow 128, C.I. Pigment Yellow 129, C.I. Pigment Yellow 138, C.I. Pigment Yellow 150, C.I. Pigment Yellow 151, C.I. Pigment Yellow 154, C.I. Pigment Yellow 155, C.I. Pigment Yellow 180, and C.I. Pigment Yellow 185;

Orange colored pigments include C.I. Pigment Orange 36, C.I. Pigment Orange 43, and a mixture of these pigments. Green colored pigments include C.I. Pigment Green 7, C.I. Pigment Green 36, and a mixture of these pigments;

Black colored pigments include: those manufactured by Mitsubishi Chemical Corporation, for example, No. 2300, No. 900, MCF 88, No. 33, No. 40, No. 45, No. 52, MA 7, MA 8, MA 100, and No. 2200 B; those manufactured by Columbian Carbon Co., Ltd., for example, Raven 5750, Raven 5250, Raven 5000, Raven 3500, Raven 1255, and Raven 700; those manufactured by Cabot Corporation, for example, Regal 400 R, Regal 330 R, Regal 660 R, Mogul L, Monarch 700, Monarch 800, Monarch 880, Monarch 900, Monarch 1000, Monarch 1100, Monarch 1300, and Monarch 1400; and those manufactured by Degussa, for example, Color Black FW 1, Color Black FW 2, Color Black FW 2 V, Color Black FW 18, Color Black FW 200, Color Black S 150, Color Black S 160, Color Black S 170, Printex 35, Printex U, Printex V, Printex 140 U, Special Black 6, Special Black 5, Special Black 4A, and Special Black 4.

Other types of pigments such as brown pigments, violet pigments, fluorescent pigments and metallic powder pigments can also be used as colorant. The pigments may be used alone or as a mixture of two or more pigments as colorant.

Blue colored pigments, including cyan pigments, are preferred.

The pigments may be used with or without being subjected to surface treatment of the pigment particles. Preferably, the pigments are subjected to surface treatment. Methods for surface treatment include methods of applying a surface coat of resin, methods of applying surfactant, and methods of bonding a reactive material (for example, a silane coupling agent, an epoxy compound, polyisocyanate, or the like) to the surface of the pigment. Suitable examples of pigments with surface treatment are the modified pigments described in WO 02/04210. Specifically the blue colored modified pigments described in WO 02/04210 are preferred as colorant in the present invention.

The pigments have a particle size which is preferably less than 10 µm, more preferably less than 5 µm and especially preferably less than 3 µm. The method for dispersing the pigments may be any known dispersion method which is used for the production of ink or toner or the like. Dispersing machines include an ultrasonic disperser, a sand mill, an attritor, a pearl mill, a super mill, a ball mill, an impeller, a dispenser, a KD mill, a colloid mill, a dynatron, a three-roll mill and a press kneader. Details thereof are described in "Latest Pigment Applied Technology" (CMC Publications, published in 1986).

A dispersing agent may be omitted in the preparation of dispersions of so-called self-dispersing pigments. Specific examples of self-dispersing pigments are pigments with are subjected to a surface treatment in such a way the pigment surface is compatible with the dispersing liquid. Typical examples of self-dispersing pigments in an aqueous medium are pigments which have ionic or ionisable groups or polyethyleneoxide chains coupled to the particle-surface. Examples of ionic or ionisable groups are acid groups or salts thereof such as carboxylic acid group, sulphonic acid, phosphoric acid or phosphonic acid and alkali metal salts of these acids. Suitable examples of self-dispersing pigments are described in WO 02/04210 and these are preferred in the present invention. The blue colored self-dispersing pigments in WO 02/04210 are preferred.

Typically, the amount of pigment in the coating may be in the range of about 0.005 $g/m^2$ to 2 $g/m^2$, preferably about 0.007 $g/m^2$ to 0.5 $g/m^2$, more preferably about 0.01 $g/m^2$ to 0.2 $g/m^2$, most preferably about 0.01 $g/m^2$ to 0.1 $g/m^2$.

The colorant can also be a dye. Any known dyes, such as commercially available dyes or dyes described in, for example, "Dye Handbook" (edited by the Organic Synthetic Chemistry Association, published in 1970) which are colored for the human eye, can be used as colorant in the photopolymerizable coating. Specific examples thereof include azo dyes, metal complex salt azo dyes, pyrazolone azo dyes, anthraquinone dyes, phthalacyanine dyes, carbionium dyes, quinonimine dyes, methine dyes, and the like. Phthalocyanine dyes are preferred. Suitable dyes are salt-forming organic dyes and may be selected from oil-soluble dyes and basic dyes. Specific examples thereof are (herein is CI an abbreviation for Color Index): Oil Yellow 101, Oil Yellow 103, Oil Pink 312, Oil Green BG, Oil Bue GOS, Oil Blue 603, Oil Black BY, Oil Black BS, Oil Black T-505, Victoria Pure Blue, Crystal Violet (CI42555), Methyl Violet (CI42535), Ethyl Violet, Rhodamine B (CI415170B), Malachite Green (0142000), Methylene Blue (CI52015). Also, the dyes disclosed in GB 2 192 729 may be used as colorant.

Typically, the amount of dye in the coating may be in the range of about 0.005 $g/m^2$ to 2 $g/m^2$, preferably about 0.007 $g/m^2$ to 0.5 $g/m^2$, more preferably about 0.01 $g/m^2$ to 0.2 $g/m^2$, most preferably about 0.01 $g/m^2$ to 0.1 $g/m^2$.

Printing-Out Agent

The photopolymerizable layer or another layer of the coating may also comprise a printing-out agent, i.e. a compound which is capable of changing the color of the coating upon exposure. After image-wise exposing of the precursor, a visible image can be produced, hereinafter also referred to as "print-out image". The printing-out agent may be a compound as described in EP-A-1 491 356 paragraph [0116] to [0119] on page 19 and 20, and in US 2005/8971 paragraph [0168] to [0172] on page 17. Preferred printing-out agents are the IR-dyes as described in EP-A 1 736 312, from line 32 page 5 to line 9 page 32 and the IR-dyes described in WO 2006/136543.

The Contrast

The contrast of the image formed after image-wise exposure and processing with a gum solution is defined as the difference between the optical density at the exposed area to the optical density at the non-exposed area, and this contrast is preferably as high as possible. This enables the end-user to establish immediately whether or not the precursor has already been exposed and processed with a gum solution, to distinguish the different color selections and to inspect the quality of the image on the treated plate precursor.

The contrast increases with increasing optical density in the exposed area and/or decreasing optical density in the non-exposed areas. The optical density in the exposed area may increase with the amount and extinction coefficient of the colorant remaining in the exposed areas and the intensity of color formed by the printing-out agent. In the non-exposed areas it is preferred that the amount of colorant is as low as possible and that the intensity of color print-out agent is as low as possible. The optical density can be measured in reflectance by an optical densitometer, equipped with several filters (e.g. cyan, magenta, yellow). The difference in optical density at the exposed area and the non-exposed area has preferably a value of at least 0.3, more preferably at least 0.4, most preferably at least 0.5. There is no specific upper limit for the contrast value, but typically the contrast is not higher than 3.0 or even not higher than 2.0. In order to obtain a good visual contrast for a human observer the type of color of the colorant may also be important. Preferred colors for the colorant are cyan or blue colors, i.e. under blue color we understand a color that appears blue for the human eye.

The Top Layer

The coating may comprise a top layer which acts as an oxygen so barrier layer, hereinafter also referred to as "overcoat layer" or "overcoat". Preferred binders which can be used in the top layer are polyvinyl alcohol and the polymers disclosed in EP-A-3103498, filed on Sep. 22, 2003, U.S. Pat. No. 6,410,205 and EP 1 288 720, including the cited references in these patents and patent applications. The most preferred binder for the toplayer is polyvinylalcohol. The polyvinylalcohol has preferably an hydrolysis degree ranging between 74 mol % and 99 mol %. The weight average molecular weight of the polyvinylalcohol can be measured by the viscosity of an aqueous solution, 4% by weight, at 20° C. as defined in DIN 53 015, and this viscosity number ranges preferably between 3 and 26, more preferably between 3 and 15, most preferably between 3 and 10.

The coating thickness of the top layer is preferably between 0.25 and 1.75 $g/m^2$, more preferably between 0.25 and 1.3 $g/m^2$, most preferably between 0.25 and 1.0 $g/m^2$. In a more preferred embodiment of the present invention, the toplayer has a coating thickness between 0.25 and 1.75 $g/m^2$ and comprises a polyvinylalcohol having an hydrolysis degree ranging between 74 mol % and 99 mol % and a viscosity number as defined above ranging between 3 and 26.

In a preferred embodiment, the composition and the thickness of the toplayer are optimised in order to obtain a high sensitivity, a good daylight stability and less or no sludge formation during off-press processing with a gum solution. In order to reduce sludge, the toplayer comprises less polyvinylalcohol and polyvinylalcohol with a lower molecular weight, preferably a viscosity number of less than 26, more preferably less than 10 is used and a thickness as low as possible but more than 0.25 $g/m^2$. In order to improve the sensitivity, the good oxygen barrier is desired, using a polyvinylalcohol with a high hydrolysis degree, preferably 88-98%, and a bigger thickness or the toplayer. In order to improve the daylight stability, small penetration of oxygen is desired by a using an oxygen barrier with reduced barrier property for oxygen, preferably by using a smaller thickness of the toplayer and with polyvinylalcohol having a lower hydrolysis degree. Due to a good balance of these elements, an optimised property for the precursor can be obtained.

The top layer may also comprise a component selected from the compounds of the gum solution as described above.

Exposure

The image-wise exposing step is carried out in a plate setter, i.e. an exposure apparatus suitable for image-wise exposing the precursor by a laser such as a laser diode, emitting around 830 nm, a NdYAG laser, emitting around 1060 nm, a violet laser, emitting around 400 nm, or a gas laser such as Ar laser, or by a digital modulated UV-exposure, e.g. by means of digital mirror devices, or by a conventional exposure in contact with a mask. In a preferred embodiment of the present invention, the precursor is image-wise exposed by a laser emitting IR-light or violet light.

Preheating

After this image-wise exposing step, the precursor is optionally heated to enhance or to speed-up the polymerization and/or crosslinking reaction. This preheat step is preferably carried out in a preheating unit at a temperature of 80° C. to 150° C. and during a dwell time of preferably 5 seconds to 1 minute. The preheating unit is preferably provided with heating elements such as IR-lamps, UV-lamps, heated air, a heated metal roll, etc.

In a preferred embodiment of the present invention, the precursor is not heated after the imaging step b) and before the processing step d).

Processing

After the exposing step or, when a preheating step is present, after the preheating step, the precursor processed with a gum solution or on-press processed with fountain and ink.

The Gum Solution

A gum solution is typically an aqueous liquid which comprises one or more surface protective compounds that are capable of protecting the lithographic image of a printing plate against contamination, e.g. by oxidation, fingerprints, fats, oils or dust, or damaging, e.g. by scratches during handling of the plate. Suitable examples of such compounds are film-forming hydrophilic polymers or surfactants. The layer that remains on the plate after treatment with the gum solution preferably comprises between 0.005 and 20 g/m$^2$ of the surface protective compound, more preferably between 0.010 and 10 g/m$^2$, most preferably between 0.020 and 5 g/m$^2$.

In the present description, all concentrations of compounds present in the gum solution are expressed as percentage by weight (wt. % or % w/w) relative to the ready-to-use gum solution, unless otherwise indicated. A gum solution may be normally supplied as a concentrated solution which is diluted by the end user with water to a ready-to-use gum solution before use according to the instructions of the supplier, usually 1 part of the gum is diluted with 1 part to 10 parts of water.

Preferred polymers for use as protective compound in the gum solution are gum arabic, pullulan, cellulose derivatives such as carboxymethylcellulose, carboxyethylcellulose or methylcellulose, (cyclo)dextrin, poly(vinyl alcohol), poly(vinyl pyrrolidone), polysaccharide, homo- and copolymers of acrylic acid, methacrylic acid or acrylamide, a copolymer of vinyl methyl ether and maleic anhydride, a copolymer of vinyl acetate and maleic anhydride or a copolymer of styrene and maleic anhydride. Highly preferred polymers are homo- or copolymers of monomers containing carboxylic, sulfonic or phosphonic groups or the salts thereof, e.g. (meth)acrylic acid, vinyl acetate, styrene sulfonic acid, vinyl sulfonic acid, vinyl phosphonic acid or acylamidopropane sulfonic acid.

Examples of surfactants for use as surface protective agent include anionic or nonionic surfactants. The gum solution may also comprise one or more of the above hydrophilic polymers as surface protective agent and, in addition, one or more surfactants to improve the surface properties of the coated layer. The surface tension of the gum solution is preferably from 20 to 50 mN/m.

The gum solution comprises preferably an anionic surfactant, more preferably an anionic surfactant whereof the anionic group is a sulphonic acid group.

Examples of the anionic surfactant include aliphates, abietates, hydroxyalkanesulfonates, alkanesulfonates, dialkylsulfosuccinates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrenemaleic anhydride copolymers, partially saponified compounds of olefin-maleic anhydride copolymers, and naphthalenesulfonateformalin condensates. Particularly preferred among these anionic surfactants are dialkylsulfosuccinates, salts of alkylsulfuric esters and alkylnaphthalenesulfonates.

Specific examples of suitable anionic surfactants include sodium dodecylphenoxybenzene disulfonate, the sodium salt of alkylated naphthalenesulfonate, disodium methylene-dinaphthalene-disulfonate, sodium dodecyl-benzenesulfonate, sulfonated alkyl-diphenyloxide, ammonium or potassium perfluoroalkylsulfonate and sodium dioctyl-sulfosuccinate.

Suitable examples of the nonionic surfactants include polyoxyethylene alkyl ethers, polyoxyethylene alkyl aryl ethers wherein the aryl group may be a phenyl group, a naphthyl group or an aromatic heterocyclic group, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, polyethyleneglycolaliphatic esters, partial esters of poly-glycerinaliphatic acids, polyoxyethylenated castor oils, partial esters of polyoxyethyleneglycerinaliphatic acids, aliphatic diethanolamides, N,N-bis-2-hydroxyalkylamines, polyoxyethylene alkylamines, triethanolaminealiphatic esters, and trialkylamine oxides. Particularly preferred among these nonionic surfactants are polyoxyethylene alkylphenyl ethers, polyoxyethylene alkylnaphthyl ethers and poloxyethylene-polyoxypropylene block polymers. Further, fluorinic and siliconic anionic and nonionic surfactants may be similarly used.

Two or more of the above surfactants may be used in combination. For example, a combination of two or more different anionic surfactants or a combination of an anionic surfactant and a nonionic surfactant may be preferred. The amount of such a surfactant is not specifically limited but is preferably from 0.01 to 30 wt. %, more preferably from 0.05 to 20 wt. %.

According to the present invention the gum solution has a pH-value preferably between 3 and 9, more preferably between 4.5 and 8.5, most preferably between 5 and 7. The pH of the gum solution is usually adjusted with a mineral acid, an organic acid or an inorganic salt in an amount of from 0.01 to 15 wt. %, preferably from 0.02 to 10 wt. %. Examples of the mineral acids include nitric acid, sulfuric acid, phosphoric acid and metaphosphoric acid. Especially organic acids are used as pH control agents and as desensitizing agents. Examples of the organic acids include carboxylic acids, sulfonic acids, phosphonic acids or salts thereof, e.g. succinates, phosphates, phosphonates, sulfates and sulfonates. Specific examples of the organic acid include citric acid, acetic acid, oxalic acid, malonic acid, p-toluenesulfonic acid, tartaric acid, malic acid, lactic acid, levulinic acid, phytic acid and organic phosphonic acid.

The gum solution further comprises preferably an inorganic salt. Examples of the inorganic salt include magnesium nitrate, monobasic sodium phosphate, dibasic sodium phosphate, nickel sulfate, sodium hexametaphosphate and sodium tripolyphosphate. An alkali-metal dihydrogen phosphate such as $KH_2PO_4$ or $NaH_2PO_4$ is most preferred. Other inorganic salts can be used as corrosion inhibiting agents, e.g. magnesium sulfate or zinc nitrate. The mineral acid, organic acid or inorganic salt may be used singly or in combination with one or more thereof.

In accordance with another embodiment of the present invention, the gum solution as developer in the processing of the plate comprises preferably a mixture of an anionic surfactant and an inorganic salt. In this mixture the anionic surfactant is preferably an anionic surfactant with a sulphonic acid group, more preferably an alkali-metal salt of a mono- or di-alkyl substituted diphenylether-sulphonic acid, and the inorganic salt is preferably a mono or dibasic phosphate salt, more preferably an alkali-metal dihydrogen phosphate, most preferably $KH_2PO_4$ or $NaH_2PO_4$.

In accordance with another embodiment of the present invention, the gum solution comprising a mixture of an anionic surfactant and an inorganic salt has preferably a pH-value between 3 and 9, more preferably between 4 and 8, most preferably between 5 and 7.

Besides the foregoing components, a wetting agent such as ethylene glycol, propylene glycol, triethylene glycol, butylene glycol, hexylene glycol, diethylene glycol, dipropylene glycol, glycerin, trimethylol propane and diglycerin may also be present in the gum solution. The wetting agent may be used singly or in combination with one or more thereof. In general, the foregoing wetting agent is preferably used in an amount of from 1 to 25 wt. %.

Further, a chelate compound may be present in the gum solution. Calcium ion and other impurities contained in the diluting water can have adverse effects on printing and thus cause the contamination of printed matter. This problem can be eliminated by adding a chelate compound to the diluting water. Preferred examples of such a chelate compound include organic phosphonic acids or phosphonoalkanetricarboxylic acids. Specific examples are potassium or sodium salts of ethylenediaminetetraacetic acid, diethylenetriaminepentaacetic acid, triethylenetetraminehexaacetic acid, hydroxyethylethylenediaminetriacetic acid, nitrilotriacetic acid, 1-hydroxyethane-1,1-diphosphonic acid and aminotri (methylenephosphonic acid). Besides these sodium or potassium salts of these chelating agents, organic amine salts are useful. The preferred amount of such a chelating agent to be added is from 0.001 to 5 wt. % relative to the gum solution in diluted form.

Further, an antiseptic and an anti-foaming agent may be present in the gum solution. Examples of such an antiseptic include phenol, derivatives thereof, formalin, imidazole derivatives, sodium dehydroacetate, 4-isothiazoline-3-one derivatives, benzoisothiazoline-3-one, benztriazole derivatives, amidineguanidine derivatives, quaternary ammonium salts, pyridine derivatives, quinoline derivatives, guanidine derivatives, diazine, triazole derivatives, oxazole and oxazine derivatives. The preferred amount of such an antiseptic to be added is such that it can exert a stable effect on bacteria, fungi, yeast or the like. Though depending on the kind of bacteria, fungi and yeast, it is preferably from 0.01 to 4 wt. % relative to the gum solution in diluted form. Further, preferably, two or more antiseptics may be used in combination to exert an aseptic effect on various fungi and bacteria. The anti-foaming agent is preferably silicone anti-foaming agents. Among these anti-foaming agents, either an emulsion dispersion type or solubilized type anti-foaming agent may be used. The proper amount of such an anti-foaming agent to be added is from 0.001 to 1.0 wt. % relative to the gum solution in diluted form.

In addition to the foregoing ingredients a radical stabilizing compound may be present in the gum. The proper amount of such radical stabilizing compound to be added is from 0.01 to 5 wt % relative to the gum solution in ready-to-used concentration. Typical radical stabilizers are disclosed in WO 2005/109103.

Besides the foregoing components, an ink receptivity agent may be present in the gum solution if desired. Examples of such an ink receptivity agent include turpentine oil, xylene, toluene, low heptane, solvent naphtha, kerosine, mineral spirit, hydrocarbons such as petroleum fraction having a boiling point of about 120° C. to about 250° C., diester phthalates (e.g., dibutyl phthalate, diheptyl phthalate, di-n-octyl phthalate, di(2-ethylhexyl)phthalate, dinonyl phthalate, didecyl phthalate, dilauryl phthalate, butylbenzyl phthalate), aliphatic dibasic esters (e.g., dioctyl adipate, butylglycyl adipate, dioctyl azelate, dibutyl sebacate, di(2-ethylhexyl)sebacate dioctyl sebacate), epoxidated triglycerides (e.g., epoxy soybean oil), ester phosphates (e.g., tricresyl phosphate, trioctyl phosphate, trichloroethyl phosphate) and plasticizers having a solidification point of 15° C. or less and a boiling point of 300° C. or more at one atmospheric pressure such as esters of benzoates (e.g., benzyl benzoate). Examples of other solvents which can be used in combination with these solvents include ketones (e.g., cyclohexanone), halogenated hydrocarbons (e.g., ethylene dichloride), ethylene glycol ethers (e.g., ethylene glycol monomethyl ether, ethylene glycol monophenyl ether, ethylene glycol monobutyl ether), aliphatic acids (e.g., caproic acid, enathic acid, caprylic acid, pelargonic acid, capric acid, undecylic acid, lauric acid, tridecylic acid, myristic acid, pentadecylic acid, palmitic acid, heptadecylic acid, stearic acid, nonadecanic acid, arachic acid, behenic acid, lignoceric acid, cerotic acid, heptacosanoic acid, montanic acid, melissic acid, lacceric acid, isovaleric acid) and unsaturated aliphatic acids (e.g., acrylic acid, crotonic acid, isocrotonic acid, undecyclic acid, oleic acid, elaidic acid, cetoleic acid, erucic acid, butecidic acid, sorbic acid, linoleic acid, linolenic acid, arachidonic acid, propiolic acid, stearolic acid, clupanodonic acid, tariric acid, licanic acid). Preferably, it is an aliphatic acid which is liquid at a temperature of 50° C., more preferably has from 5 to 25 carbon atoms, most preferably has from 8 to 21 carbon atoms. The ink receptivity agent may be used singly or in combination with one or more thereof. The ink receptivity agent is preferably used in an amount of from 0.01 to 10 wt %, more preferably from 0.05 to 5 wt %. The foregoing ink receptivity agent may be present as an oil-in-water emulsion or may be solubilized with the aid of a solubilizing agent.

The viscosity of the gum solution can be adjusted to a value of e.g. between 1 and 5 mPa·s, by adding viscosity increasing compounds, such as poly(ethylene oxide) or polyvinylalcohol, e.g. having a molecular weight between $10^4$ and $10^7$. Such compounds can be present in a concentration of 0.01 to 10 g/l.

A baking gum has a similar composition as described above, with the additional preference towards compounds that do not evaporate at the usual bake temperatures. Baking gum solutions or baking gumming solutions can be aqueous solutions of sodium dodecyl phenoxy benzene disulphonate, alkylated naphthalene sulphonic acid, sulphonated alkyl diphenyl oxide, methylene dinaphtalene sulphonic acid, etc. Other gumming solutions contain a hydrophilic polymer component and an organic acid component. Still other baking gumming solutions contains the potassium salt of the hydroxyethylidene diphosphonic acid. Still other baking gumming solutions contain a sulphosuccinamate compound and phosphoric acid.

The contact angle between the baking gum solution and the plate is preferably lowered by adding at least one surfactant. Preferred surfactants are non-ionic polyglycols and perfluorated aliphatic polyester acrylates.

The viscosity of the baking gum solution is brought at a value of 1 to 5 mPa·s, more preferably 2 to 4.5 mPa·s by adding at least one viscosity increasing compound. Preferred viscosity increasing compounds are hydrophilic polymer compounds, more preferably polyethylene oxides. Said polyethylene oxides have preferably a molecular weight between 100,000 and 10,000,000, more preferably between 500,000 and 5,000,000. They are preferably used in a concentration of 0.01 to 10 g/l, more preferably of 0.05 to 5 g/l.

In another embodiment the baking gumming solutions comprises (a) water, (b) at least one hydrophilic polymer and (c) at least one component selected from the group consisting of water soluble organic acids comprising at least two acid functions and being selected form the group consisting of a benzene carboxylic acid, a benzene sulphonic acid, a benzene phosphonic acid, an alkane phosphonic acid and water soluble salts thereof. The mentioned compounds (b) and (c) which are dissolved in the aqueous solution in accordance with the present invention are such that they do not evaporate at the customary baking temperatures. The protective layer which is formed remains water-soluble, even after baking, and can be readily removed without damaging the printing plate.

Component (b) comprises in particular the following hydrophilic polymers: N-polyvinyl-pyrrolidone, polyvinylmethylether, copolymers containing ethylene units and maleic anhydride units, homopolymers or copolymers containing vinyl phosphonic acid units, vinyl methyl phosphinic acid units and/or acrylic acid units and/or a polyalkylene glycol, such as polyethylene glycol.

Component (c) comprises in particular: benzene disulphonic acids, benzene polycarboxylic acids having from 3 to 6 carboxyl groups, alkane diphosphonic acids which having from 1 to 3 carbon atoms in the alkane group, carboxyl group containing alkane diphosphonic acids which have from 5 to 9 carbon atoms in the alkane group, and/or one of the water-soluble salts of these acids (preferably alkali metal salts or ammonium salts). Specific examples of component (c) include benzene-1,3-disulphonic acid, benzene-1,2,4-tricarboxylic acid (trimellitic acid), benzene 1,2,4,5-tetracarboxylic acid (pyromellitic acid), benzene hexacarboxylic acid (mellitic acid), methane diphosphonic acid (diphosphono methane), 4,4-diphosphono-heptane-1,7-dioic acid (3,3-diphosphono-pimeic acid), and the sodium salts of these acids. In other embodiments the baking gumming solution for use can additionally contain hydroxy-polycarboxylic acids, such as citric acid and/or the salts thereof, water soluble alkanediols having at least 4 carbon atoms, such as hexanediol-(1,6) and surfactants (preferably anionic or non-ionic surfactants) such as alkyl aryl sulphonates, alkyl phenol ether sulphonates and a natural surfactant (e.g. Saponin). Specific examples of suitable baking gum solutions, ingredients and concentrations thereof, can be found in e.g. EP-A 222 297, EP-A 1 025 992, DE-A 2 626 473 and U.S. Pat. No. 4,786, 581.

Gum-Processing

In the gum-processing, the precursor is developed by applying a gum solution to the coating of the precursor, thereby removing the non-exposed areas of the photopolymerizable layer from the support to such an extent that no toning occurs during the printing process, and gumming the plate in a single step. This processing can be carried out in a gumming station which comprises at least one gumming unit wherein the gum is applied to the precursor by a spraying, jetting, dipping or coating technique or by rubbing in with an impregnated pad or by pouring-in, either by hand or in an automatic apparatus.

An example of a spray nozzle which can be used in the spraying technique, is an air assisted spray nozzle of the type SUJ1, commercially available at Spraying Systems Belgium, Brussels. The spray nozzle may be mounted on a distance of 50 mm to 200 mm between nozzle and receiving substrate. The flow rate of the spray solution may be set to 7 ml/min. During the spray process an air pressure in the range of $4.80 \times 10^5$ Pa may be used on the spray head. This layer may be dried during the spraying process and/or after the spraying process. Typical examples of jet nozzles which can be used in the jetting technique, are ink-jet nozzles and valve-jet nozzles.

At least one of the gumming units may be provided with at least one roller for rubbing and/or brushing the coating while applying the gum to the coating. The gum used in the developing step can be collected in a tank and the gum can be used several times. The gum can be replenished by adding a replenishing solution to the tank of the gumming unit. In an alternative way, the gum solution may be used once-only, i.e. only starting gum solution is applied to the coating by preferably a spraying or jetting technique. Said starting gum solution is a gum solution which has not been used before for developing a precursor and has the same composition as the gum solution used at the start of the development.

Said replenishing solution is a solution which may be selected from a starting gum solution, a concentrated gum solution, a diluted gum solution, a solution of a non-ionic surfactant, water, a solution of a buffer having a pH ranging between 4 and 9, preferably between 5 and 7, or a baking gum. A concentrated or diluted gum solution is a solution comprising a higher respectively lower concentration of gum additives as defined above. A concentrated gum solution can be added as replenishing solution when the concentration of active products is under a desired level in the gum solution. A diluted gum solution or water can be used when the concentration of active products is above a desired level in the gum solution or when the viscosity of the gum solution is increased or when the volume of the gum solution is under a desired level, e.g. due to evaporation of the solvent or water. A solution of a non-ionic surfactant or a solution of a buffer can be added when the gum solution needs a higher concentration of a surfactant or when the pH of the gum solution needs to be controlled at a desired pH value or at a desired pH value in a range of two pH values, e.g. between 4 and 9, preferably between 5 and 7.

The addition of replenishing solution, i.e. the type and the amount of replenishing solution, may be regulated by the measurement of at least one of the following parameters such as the number and area of plate precursor developed, the time period of developing, the volume in each gumming unit (minimum and maximum level), the viscosity (or viscosity increase) of the gum solution, the pH (or pH change) of the gum solution, the density (or density increase) of the gum solution and the conductivity (or conductivity increase) of the gum solution, or a combination of at least two of them. The density (or density increase) of the gum solution can be measured with a PAAR densitometer.

The gum solution used in this step has preferably a temperature ranging between 15° C. and 85° C., more preferably between 18° C. and 65° C., most preferably between 20° C. and 55° C.

In a preferred embodiment of the present invention, the gumming station comprises a first and a second gumming unit whereby the precursor is firstly developed in the first gumming unit and subsequently developed in the second gumming unit. The precursor may be firstly developed in the first gumming unit with gum solution which has been used in the second gumming unit, and, subsequently, developed in the second gumming unit with starting gum solution by preferably a spraying or jetting technique. In an alternative way, the first and second gumming unit preferably have the configuration of a cascade system, whereby the gum solution used for developing the precursor in the first and second gumming unit are respectively present in a first and a second tank, and whereby the gum solution of the second tank overflows to the first tank when replenishing solution is added in the second gumming unit. Optionally, also to the first gumming unit a replenishing solution can be added and this replenishing solution may be the same or another replenishing solution than added to the second gumming unit, e.g. a diluted gum solution, a solution of a non-ionic surfactant or water can be added as replenisher to the first gumming unit.

In another embodiment of the present invention, the gumming station comprises a first, a second and a third gumming unit whereby the precursor is firstly developed in the first gumming unit, subsequently in the second gumming unit and finally in the third gumming unit. The precursor may be firstly developed in the first gumming unit with gum solution which has been used in the second gumming unit, subsequently developed in the second gumming unit with gum solution which has been used in the third gumming unit, and finally developed in the third gumming unit with starting gum solution by preferably a spraying or jetting technique. In an alternative way, the first, second and third gumming unit preferably have the configuration of a cascade system, whereby the gum solution used for developing the precursor in the first, second and third gumming unit are respectively present in a first, a second and a third tank, and whereby the gum solution of the third tank overflows to the second tank when replenishing solution is added in the third gumming unit, and whereby the gum solution of the second tank overflows to the first tank. Optionally, also to the second and/or first gumming unit(s) a replenishing solution may be added and this replenishing solution may be the same or another replenishing solution than added to the third gumming unit, e.g. a diluted gum solution, a solution of a non-ionic surfactant or water can be added as replenisher to the second or first gumming unit. In another option, two different replenishing solutions can also be added to one gumming unit, e.g. a starting gum solution and water.

In another embodiment of the present invention, the gum solution used in each of the gumming units may be regenerated by removing of insoluble material present in the gum solution of a gumming unit. The presence of insoluble material in the gum solution may be caused by several reasons, e.g. by developing of a pigment containing coating, by evaporation of solvent or water of the gum solution, or by sedimentation, coagulation or flocculation of components in the gum solution. The insoluble material can be removed continuously or in batch form by several techniques such as filtration, ultrafiltration, centrifugation or decantation. A suitable apparatus for disposing a waste developing solution such as the gum solution of the present invention is described in EP-A 747 773. The apparatus can be connected to the tank of a gumming unit to regenerate the used gum solution by circulation of the gum solution over a filter or a filter membrane. The gum solution can be circulated over the filter or filter membrane continuously, periodically or during the development time, or the circulation is regulated by the measurement of the turbidity or transparency (i.e. optical transmission) of the gum solution whereby the circulation starts when the turbidity exceeds an upper value and stops when a under value is reached. The upper and under turbidity value can be chosen in relation to the desired degree of purification, generally the optical transmission of the gum solution is not lower than 50% of its value at starting, preferably not lower than 80%, more preferably not lower than 95%.

The plate can be dried after the gum-processing step in a drying unit. In a preferred embodiment the plate is dried by heating the plate in the drying unit which may contain at least one heating element selected from an IR-lamp, an UV-lamp, a heated metal roller or heated air. In a preferred embodiment of the present invention, the plate is dried with heated air as known in the drying section of a classical developing machine.

The plate can be heated in a baking unit, optionally after drying the plate. In a preferred embodiment of the present invention, when the plate is heated in a baking unit, the precursor is developed by using a baking gum and the gum solution is preferably replenished by adding a replenishing baking gum. Said replenishing baking gum is a solution which may be selected from a starting baking gum, i.e. a solution having the same composition as the baking gum used at the start of the development, a concentrated baking gum or a diluted baking gum, i.e. a solution having a higher respectively lower concentration of additives than the starting baking gum, and water.

The baking unit may contain at least one heating element selected from an IR-lamp, an UV-lamp, a heated metal roller or heated air. The plate is preferably heated in the baking unit at a temperature above 150° C. and less than the decomposition temperature of the coating, more preferably between 200° C. and 295° C., most preferably between 250° C. and 290° C. A longer heating time is usually used when a lower heating temperature is used, and a shorter heating time is used when a higher heating temperature is used. The plate is preferably heated over a time period of less than 10 minutes, more preferably less than 5 minutes, most preferably less than 2 minutes.

The plate can be heated by the method as described in EP-A 1 506 854 or WO 2005/015318.

The drying step and the heating step may be combined in one single step wherein the plate, after the gum-developing step, is dried and heated in an integrated drying-baking station.

On-Press Processing

In the on-press processing, the precursor is processed on-press, i.e. while the precursor is mounted on the plate cylinder of a lithographic printing press, the plate cylinder rotates while feeding dampening liquid and/or ink to the coating of the precursor. After a number of revolutions of the plate cylinder, preferably less than 50 revolutions, more preferably less than 10 revolutions, most preferably less than 5 revolutions, the non-exposed areas of the coating are removed from the support.

In a preferred embodiment, only dampening liquid is supplied to the plate during start-up of the press, and after a few revolutions the ink supply is switched on.

In an alternative embodiment, supply of dampening liquid and ink can be started simultaneously or only ink can be supplied during a number of revolutions before switching on the supply of dampening liquid.

In another alternative embodiment, a single fluid ink is supplied to the plate in this on-press processing. Single-fluid ink consists of an ink phase, also called the hydrophobic or oleophilic phase, and a polar phase which replaces the aqueous dampening liquid that is used in conventional wet offset printing. Suitable examples of single-fluid inks have been described in U.S. Pat. No. 4,045,232; U.S. Pat. No. 4,981,517 and U.S. Pat. No. 6,140,392. In a most preferred embodiment, the single-fluid ink comprises an ink phase and a polyol phase as described in WO 00/32705.

EXAMPLES

Preparation of Aluminum Support S-1

A 0.3 mm thick aluminium foil was degreased by spraying with an aqueous solution containing 26 g/l NaOH at 65° C. for 2 seconds and rinsed with demineralised water for 1.5 seconds. The foil was then electrochemically grained during 10 seconds using an alternating current in an aqueous solution containing 15 g/l HCl, 15 g/l $SO_4^{2-}$ ions and 5 g/l $Al^{3+}$ ions at a temperature of 37° C. and a current density of about 100 $A/dm^2$. Afterwards, the aluminium foil was then desmutted by etching with an aqueous solution containing 5.5 g/l of NaOH at 36° C. for 2 seconds and rinsed with demineralised water for 2 seconds. The foil was subsequently subjected to anodic oxidation during 15 seconds in an aqueous solution containing 145 g/l of sulfuric acid at a temperature of 50° C. and a current density of 17 $Å/dm^2$, then washed with demineralised water for 11 seconds and dried at 120° C. for 5 seconds.

The support thus obtained was characterised by a surface roughness Ra of 0.35-0.4 μm (measured with interferometer NT1100) and had an anodic weight of 3.0 $g/m^2$.

Preparation of Aluminum Support S-2:

A 0.3 mm thick aluminium foil was degreased by spraying with an aqueous solution containing 34 g/l NaOH at 70° C. for 6 seconds and rinsed with demineralised water for 3.6 seconds. The foil was then electrochemically grained during 8 seconds using an alternating current in an aqueous solution containing 15 g/l HCl, 15 g/l $SO_4^{2-}$ ions and 5 g/l $Al^{3+}$ ions at a temperature of 37° C. and a current density of about 100 $A/dm^2$. Afterwards, the aluminium foil was desmutted by etching with an aqueous solution containing 145 g/l of sulfuric acid at 80° C. for 5 seconds and rinsed with demineralised water for 4 seconds. The foil was subsequently subjected to anodic oxidation during 10 seconds in an aqueous solution containing 145 g/l of sulfuric acid at a temperature of 57° C. and a current density of 33 $A/dm^2$, then washed with demineralised water for 7 seconds and post-treated for 4 seconds (by spray) with a solution containing 2.2 g/l PVPA at 70° C., rinsed with demineralised water for 3.5 seconds and dried at 120° C. for 7 seconds.

The support thus obtained was characterised by a surface roughness Ra of 0.35-0.4 μm (measured with interferometer NT1100) and had an anodic weight of 4.0 $g/m^2$.

Preparation of Intermediate Layers I-1 to I-4:

The coating compositions for the intermediate layers I-1 to I-4 were prepared by mixing the ingredients as specified in Table 1. The resulting solutions were coated with a bar-coater on a support or on another intermediate layer as specified in Table 4. After coating, the coating was dried for 1 minute at 120° C. in a circulation oven.

TABLE 1

Compositions of the intermediate layer solutions and dry coating weight (in $g/m^2$).

| COMPOSITION/ INGREDIENTS | I-1 | I-2 | I-3 | I-4 |
|---|---|---|---|---|
| Sipomer PAM 100 (1) (g) | 1.60 | 1.60 | 0.08 | |
| PVPA (2) (g) | | 0.67 | | |
| PAA (3) (g) | | | 0.2 | 2.4 |
| Dowanol PM (4) (g) | 98.4 | | 4.92 | 97.6 |
| Water (g) | | 97.73 | 4.80 | |
| Dry coating weight $(g/m^2)$ | 0.08 | 0.10 | 0.05 | 0.012 |

(1) Sipomer PAM 100 is a phosphate functional speciality methacrylate monomer, obtained from RHODIA. This compound was treated by extraction with methyl-tert-butylether, collection of the lower phase, and subsequent addition of 250 ppm (parts per million) of para-methoxyphenol; used as a 50 wt % solution in Dowanol PM.
(2) PVPA is a 30 wt % solution in water of polyvinyl phosphonic acid, commercially available from Clariant.
(3) PAA is Glascol E15D which is a 5 wt % solution in water of a polyacrylic acid, having a $M_w$ of 2500000, commercially available from Ciba-Geigy.
(4) Dowanol PM is propylene glycol monomethylether, trade mark of Dow Chemical Company.

Preparation of Photosensitive Layers P-1 to P-8:

The coating compositions for the photosensitive layers P-1 to P-8 were prepared by mixing the ingredients as specified in Table 2. The resulting solutions were coated with a bar-coater at a wet thickness setting of 10 μm on a support or on an intermediate layer as specified in Table 4. After coating, the coating was dried for 1 minute at 120° C. in a circulation oven. The resulting applied amount is indicated in Table 2.

TABLE 2

Compositions of the photosensitive layer solutions and dry coating weight (in $g/m^2$).

| INGREDIENT | P-1 | P-2 | P-3 | P-4 | P-5 | P-6 | P-7 | P-8 |
|---|---|---|---|---|---|---|---|---|
| ALCOTEX (1) (g) | 3.75 | 2.989 | 2.991 | 2.991 | 3.035 | 2.091 | 3.019 | 3.035 |
| IR-dye-01 (2) (g) | 0.1175 | 0.1437 | 0.1438 | 0.1438 | 0.1438 | 0.1437 | 0.1430 | 0.1435 |

TABLE 2-continued

Compositions of the photosensitive layer solutions and dry coating weight (in g/m²).

| INGREDIENT | P-1 | P-2 | P-3 | P-4 | P-5 | P-6 | P-7 | P-8 |
|---|---|---|---|---|---|---|---|---|
| TBMPS (3) (g) | 0.222 | 0.180 | 0.180 | 0.180 | 0.180 | 0.180 | 0.179 | 0.179 |
| FST (4) (g) | 2.038 | 1.628 | 1.629 | 1.629 | 1.629 | 1.628 | 1.620 | 1.623 |
| Edaplan (5) (g) | 0.375 | 0.304 | 0.303 | 0.303 | 0.303 | 0.304 | 0.303 | 0.303 |
| Sipomer (6) (g) | | 0.639 | | 0.639 | 0.639 | 0.639 | | 0.319* |
| EGMP (7) (g) | | | | | | | 0.0794 | |
| PAA (8) (g) | | | 0.799 | 1.198 | 0.958 | 7.286 | 1.191 | |
| Albritect (9) (g) | | | | | | | | 0.199 |
| Dowanol PM (10) (g) | 39.63 | 31.79 | 31.35 | 30.65 | 30.85 | 25.75 | 30.76 | 31.82 |
| Dry coating weight (g/m²) | 0.75 | 0.83 | 0.76 | 0.845 | 0.842 | 0.83 | 0.785 | 0.832 |

(1) Alcotex 552P is a 40% by weight solution in water of polyvinylalcohol having a hydrolysis degree of 55 mol %, commercially available from Synthomer.
(2) IR-dye-01 has the following structure

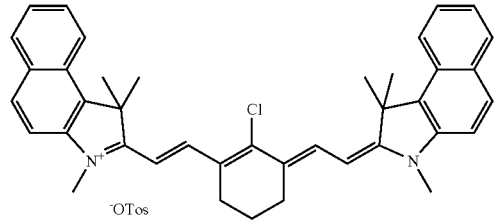

wherein ⁻OTos represents a tosylate anion.
(3) TBMPS is tribromo methyl phenyl sulphone.
(4) FST 426R is a solution in 2-butanone containing 88.2% by weight of a reaction product from 1 mole of 2,2,4-trimethyl-hexamethylenediisocyanate and 2 moles of hydroethylmethacrylate (viscosity 3.30 mm²/s at 25° C.).
(5) Edaplan LA411 is a surfactant, obtained from Munzing Chemie; used as a 1 wt % solution in Dowanol PM.
(6) Sipomer PAM 100 is a phosphate functional specialty methacrylate monomer, obtained from RHODIA. This compound was treated by extraction with methyl-tert-butylether, collection of the lower phase, and subsequent addition of 250 ppm (parts per million) of para-methoxyphenol; used as a 50 wt % solution in Dowanol PM.
*For P-8: Sipomer PAM100 was not purified in advance and was used as 100% pure, instead of the Sipomer used in P-2, P-4, P-5 and P-6 as mentioned above.
(7) EGMP is ethylene glycol methacrylate phosphate, having the structure of
$H_2C=C(CH_3)-C(=O)O-CH_2-CH_2-O-P(=O)(OH)_2$, commercially available from Aldrich.
(8) PAA is Glascol E15D which is a 5 wt % solution in water of a polyacrylic acid, having a $M_w$ of 2500000, commercially available from Ciba-Geigy.
(9) Albritect CP30 is a 5 wt % solution in water of a copolymer of acrylic acid and vinylphosphonic acid (70:30), commercially available from Rhodia.
(10) Dowanol PM is propylene glycol monomethylether, trade mark of Dow Chemical Company.

Preparation of Overcoat Layer OC-1:

On top of the photosensitive layer, a solution in water with the composition as defined in Table 3 was coated and dried at 110° C. for 2 minutes. The so-formed protective overcoat OC-1 has a dry thickness or dry coating weight of 2.0 g/m².

TABLE 3

Composition of overcoat solution.

| COMPONENT | OC-1 |
|---|---|
| partially hydrolyzed polyvinylalcohol (degree of hydrolysis 88%, viscosity 4 mPa · s in a solution of 4 wt. % at 20° C.) (g) | 17.03 |
| partially hydrolyzed polyvinylalcohol (degree of hydrolysis 88%, viscosity 8 mPa · s in a solution of 4 wt. % at 20° C.) (g) | 7.43 |
| fully hydrolyzed polyvinylalcohol (degree of hydrolysis 98%, viscosity 6 mPa · s in a solution of 4 wt. % at 20° C.) (g) | 14.87 |
| Acticide LA1206 (1) (g) | 0.26 |
| Metolat FC 355 (2) (g) | 0.38 |
| Lutensol A8 (90%) (3) (g) | 0.032 |
| Water (g) | 960 |

(1) Acticide LA1206 is a biocide, commercially available from Thor.
(2) Metolat FC 355 is an ethoxylated ethylenediamine, commercially available from Münzing Chemie.
(3) Lutensol A8 (90% by weight) is a surface active agent, commercially available from BASF.

Preparation of the Printing Plate Precursors PPP-01 to PPP-14.

The compositions of the printing plate precursors PPP-01 to PPP-14 are summarized in Table 4. For PPP-06 the support is coated with two intermediate layers, namely 1-4 is firstly coated on the support and thereon I-1, and then P-1 is coated on I-1.

TABLE 4

Precursor composition.

| Printing Plate Precursor | Al support | Inter-mediate layer | Photopolymerizable layer | Overcoat layer |
|---|---|---|---|---|
| PPP-01 | S-1 | I-1 | P-1 | OC-1 |
| PPP-02 | S-2 | I-1 | P-1 | OC-1 |
| PPP-03 | S-1 |  | P-2 | OC-1 |
| PPP-04 | S-2 |  | P-2 | OC-1 |
| PPP-05 | S-1 |  | P-3 | OC-1 |
| PPP-06 | S-1 | I-4 then I-1 | P-1 | OC-1 |
| PPP-07 | S-2 |  | P-1 | OC-1 |
| PPP-08 | S-1 |  | P-6 | OC-1 |
| PPP-09 | S-1 | I-2 | P-1 | OC-1 |
| PPP-10 | S-1 | I-3 | P-1 | OC-1 |
| PPP-11 | S-1 |  | P-4 | OC-1 |
| PPP-12 | S-1 |  | P-7 | OC-1 |
| PPP-13 | S-1 |  | P-5 | OC-1 |
| PPP-14 | S-1 |  | P-8 | OC-1 |

Invention Examples 1 to 4 and Comparative Examples 1 to 8

The precursors PPP-01 to PPP-12 were imaged with a Creo Trendsetter IR-laser (830 nm; 2001 lpi) at an energy density of 150 mJ/cm$^2$.

After imaging the plate precursors were subjected to processing with Gum-1 in a CRF45 processor (dwell time 30 s, at 21° C.) available from Agfa, to remove the coating on the non-image areas from the support.

Gum-1 is a solution prepared as follow:
  To 750 g demineralised water
  100 ml of Dowfax 3B2 (commercially available from Dow Chemical)
  31.25 g 1,3-benzene disulphonic acid disodium salt (available from Riedel de Haan)
  31.25 ml Versa TL77, a polystyrene sulphonic acid (available from Alco Chemical)
  10.4 g trisodium citrate dihydrate,
  2 ml of Acticide LA1206, a biocide (available from Thor) and
  2.08 g of Polyox WSRN-750 (available from Union Carbide) were added under stirring and
  demineralised water was further added to 1000 g.
  pH is between 7.2 and 7.8.

The plates were printed on a Heidelberg GTO46 printing press and a print job was started using K+E Novavit 800 Skinnex ink (trademark of BASF Drucksysteme GmbH) and 3% PRIMA FS101 (trademark of Agfa) in 10% isopropanol as fountain solution, a compressible blanket and by using offset paper. The results are summarized in Table 5.

The plates were evaluated by the highest resolution of the image which can be obtained on printing, i.e. the smallest dots which can be reproduced on the prints. When the smallest dot which can be reproduced ranges between 1 and 3%, the resolution is high; when the smallest dot which can be reproduced ranges between 4 to 15%, the resolution is low, and when the dot size of the smallest dot which can be reproduced is >15%, the resolution is very low. In the invention examples the resolution of the image is high.

When the non-exposed areas are insufficiently removed during processing or the compounds remaining on the substrate are too hydrophobic, toning on the prints results, i.e. non-imaged areas are ink-accepting exhibiting background density. When toning is present, determination of the image resolution is not meaningful. On the other hand, when the image-wise exposed areas have poor adhesion to the substrate, they are easily worn away, resulting in poor images or even no image at all is present on the prints, and a determination of the image resolution is also not significant. Only the printing plates which are capable of rendering images of high resolution without toning, are belonging to the present invention.

TABLE 5

Results (gum-processing).

| EXAMPLE number | Printing Plate Precursor | Image Quality (smallest dot %) |
|---|---|---|
| Invention Example-01 | PPP-09 | No toning High resolution (1%) |
| Invention Example-02 | PPP-10 | No toning High resolution (2%) |
| Invention Example-03 | PPP-11 | No toning High resolution (1%) |
| Invention Example-04 | PPP-12 | No toning High resolution (2%) |
| Comparative Example-01 | PPP-01 | Toning |
| Comparative Example-02 | PPP-02 | Toning |
| Comparative Example-03 | PPP-03 | Toning |
| Comparative Example-04 | PPP-04 | Toning |
| Comparative Example-05 | PPP-05 | No toning Low resolution (6%) |
| Comparative Example-06 | PPP-06 | No toning Low resolution (6%) |
| Comparative Example-07 | PPP-07 | No toning Very low resolution (20%) |
| Comparative Example-08 | PPP-08 | No image formed |

The Invention Examples 1 to 4 demonstrate the formation of printing plates with a high resolution obtained after processing with a gum solution and without toning on the prints. These plates comprise an adhesion promoting compound and a second polymer in an intermediate layer (Invention Examples 1 and 2) or in the photopolymerizable layer (Invention Examples 3 and 4).

In the Comparative Examples 1 to 4 only an adhesion promoting compound is present in the intermediate layer (Comparative Examples 1 and 2) or in the photopolymerizable layer (Comparative Examples 3 and 4), but no second polymer is present. For these plates toning is observed on the prints.

An insufficient resolution is obtained when no adhesion promoting compound is present in the contiguous layer as demonstrated in Comparative Examples 5 to 7.

When the amount of second polymer is too high, no image is reproduced (Comparative Example 8).

Invention Examples 5 and 6

In Invention Examples 5 and 6, the precursors PPP-13 respectively PPP-14 were image-wise exposed at an energy density of 150 mJ/cm$^2$ and subsequently processed with Gum-1 as described in Invention Example 1.

The run length of the plate was tested on a Sakurai Oliver 52 printing press using K+E Novavit 800 Skinnex ink (trademark of BASF Drucksysteme GmbH) and 4% Anchor Emerald Premium 3520 fountain solution (trademark of ANCHOR), a compressible blanket and by using offset paper. The results of the printing test are summarized in Table 6.

TABLE 6

Results (run length).

| EXAMPLE number | Printing Plate Precursor | Image Resolution (smallest % dot reproduced on the prints at each run length) | | | |
|---|---|---|---|---|---|
| | | 1K | 5K | 10K | 50K |
| Invention Example-05 | PPP-13 | 1-2% | 1% | 1% | 1% |
| Invention Example-06 | PPP-14 | 1% | 1% | 1% | 2% |

In Invention Examples 5 and 6 the printing plates comprise an adhesion promoting compound and a second polymer. These examples demonstrate that images of a high resolution (1 or 2% dots) and without toning are reproduced at a high run length up to 50 000 prints.

Invention Examples 7 to 10 and Comparative Examples 9 to 16

The precursors PPP-01 to PPP-12 were imaged with a Creo Trendsetter IR-laser (830 nm; 2001 lpi) at an energy density 150 mJ/cm$^2$.

After exposure, the plates were mounted on Heidelberg GTO46 printing press and a print job was started using K+E Novavit 800 Skinnex ink (trademark of BASF Drucksysteme GmbH) and 3% PRIMA FS101 (trademark of Agfa) in 10% isopropanol as fountain solution, a compressible blanket and by using offset paper. The results are summarized in Table 7.

The plates were evaluated by the highest resolution of the image which can be obtained on printing, i.e. the smallest dots which can be reproduced on the 250$^{th}$ printed paper. When the smallest dot which can be reproduced ranges between 1 and 3%, the resolution is high; when the smallest dot which can be reproduced ranges between 4 to 15%, the resolution is low, and when the dot size of the smallest dot which can be reproduced is >15%, the resolution is very low.

The clean-out is defined as the number of prints required to obtain an optical density (measured with a GretagMacBeth D19C densitometer) on the printed paper of less than 0.005 in the non-image areas; "<5" indicates that a good clean-out is obtained after printing less than 5 prints, ">250" indicated an insufficient clean-out, this means that the coating on the non-image areas is not completely removed after printing 250 prints or that the compounds remaining on the hydrophilic support at non-image areas, are too hydrophobic, resulting in toning on the prints, i.e. non-imaged areas are ink-accepting exhibiting background density. When toning is present, determination of the image resolution is not meaningful. On the other hand, when the image-wise exposed areas have poor adhesion to the substrate, they are easily worn away, resulting in poor images or even no image at all is present on the prints, and a determination of the image resolution is also not meaningful. Only the printing plates which are capable of rendering images of high resolution without toning, are belonging to the present invention.

TABLE 7

Results (on-press processing).

| EXAMPLE number | Printing Plate Precursor | Clean-out | Image Quality (smallest dot %) |
|---|---|---|---|
| Invention Example-07 | PPP-09 | <5 | No toning High resolution (1%) |
| Invention Example-08 | PPP-10 | <5 | No toning High resolution (2%) |
| Invention Example-09 | PPP-11 | <5 | No toning High resolution (1%) |
| Invention Example-10 | PPP-12 | <5 | No toning High resolution (2%) |
| Comparative Example-09 | PPP-01 | >250 | Toning |
| Comparative Example-10 | PPP-02 | >250 | Toning |
| Comparative Example-11 | PPP-03 | >250 | Toning |
| Comparative Example-12 | PPP-04 | >250 | Toning |
| Comparative Example-13 | PPP-05 | <5 | No toning Low resolution (6%) |
| Comparative Example-14 | PPP-06 | <5 | No toning Low resolution (6%) |
| Comparative Example-15 | PPP-07 | <5 | No toning Very low resolution (20%) |
| Comparative Example-16 | PPP-08 | <5 | No image formed |

The Invention Examples 7 to 10 demonstrate the formation of printing plates with a high resolution obtained after on-press processing. The plates have a good clean-out, i.e. in less than 5 prints the coating in the non-exposed areas is completely removed from the support, and very fine dots are rendered on the prints. These plates comprise an adhesion promoting compound and a second polymer in an intermediate layer (Invention Examples 7 and 8) or in the photopolymerizable layer (Invention Examples 9 and 10).

In the Comparative Examples 9 to 12 only an adhesion promoting compound is present in the intermediate layer (Comparative Examples 9 and 10) or in the photopolymerizable layer (Comparative Examples 11 and 12), but no second polymer is present. Even after printing 250 prints, the clean-out is still insufficient and toning is observed on the prints for these plates.

An insufficient resolution is obtained when no adhesion promoting compound is present in the contiguous layer as demonstrated in Comparative Examples 13 to 15.

When the amount of second polymer is too high, no image is reproduced (Comparative Example 16).

Invention Examples 11 to 15 and Comparative Examples 17 to 19

Preparation of Photosensitive Layers P-9 to P-16

The coating compositions for the photosensitive layer P-9 to P-16 were prepared by mixing the ingredients as specified in Table 8. The resulting solutions were filtered through a filter with a pore-size of 0.22 μm, and then coated onto the support S-1 with a bar-coater at a wet thickness setting of 10 μm. After coating, the coating was dried for 1 minute at 120° C. in a circulation oven. The resulting applied amounts are indicated in Table 8.

TABLE 8

Composition of the photosensitive layer solutions (amounts in g) and the dry coating weights (in g/m$^2$).

| IN-GREDIENT | P-9 | P-10 | P-11 | P-12 | P-13 | P-14 | P-15 | P-16 |
|---|---|---|---|---|---|---|---|---|
| Dowanol PM (1) (g) | 31.90 | 31.62 | 31.62 | 31.52 | 31.58 | 31.62 | 31.61 | 31.56 |
| TBMPS (4) (g) | 0.180 | 0.180 | 0.180 | 0.180 | 0.180 | 0.180 | 0.180 | 0.180 |
| ALCOTEX (2) (g) | 3.035 | 3.035 | 3.035 | 3.035 | 3.035 | 3.035 | 3.035 | 3.035 |
| HAc (8) (g) | 0 | 0 | 0.065 | 0 | 0 | 0 | 0 | 0 |
| HCl (9) (g) | 0 | 0 | 0 | 0.176 | 0 | 0 | 0 | 0 |
| HNO$_3$ (10) (g) | 0 | 0 | 0 | 0 | 0.100 | 0 | 0 | 0 |
| PTSA (11) (g) | 0 | 0 | 0 | 0 | 0 | 0.200 | 0 | 0 |
| H$_3$PO$_4$ (12) (g) | 0 | 0 | 0 | 0 | 0 | 0 | 0.0751 | 0 |
| H$_4$P$_2$O$_7$ (13) (g) | 0 | 0 | 0 | 0 | 0 | 0 | 0 | 0.128 |
| FST (5) (g) | 1.620 | 1.620 | 1.620 | 1.620 | 1.620 | 1.620 | 1.620 | 1.620 |
| Edaplan (6) (g) | 0.303 | 0.303 | 0.303 | 0.303 | 0.303 | 0.303 | 0.303 | 0.303 |
| Sipomer (7) (g) | 0.639 | 0.639 | 0.639 | 0.639 | 0.639 | 0.639 | 0.639 | 0.639 |
| Albritect (14) (g) | 0 | 0.319 | 0.319 | 0.319 | 0.319 | 0.319 | 0.319 | 0.319 |
| IR-dye-02 (3) (g) | 0.144 | 0.144 | 0.144 | 0.144 | 0.144 | 0.144 | 0.144 | 0.144 |
| Dry coating weight (g/m$^2$) | 0.83 | 0.83 | 0.85 | 0.85 | 0.85 | 0.88 | 0.85 | 0.85 |

(1), (2), (4) to (7), (14): see Table 2
(3) IR-dye-02 has the following structure

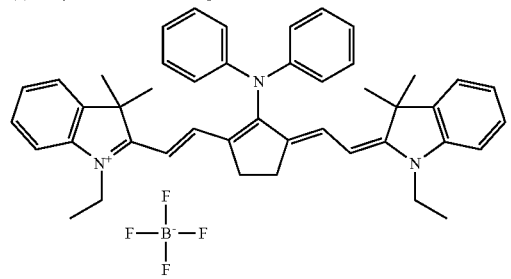

(8) HAc is acetic acid.
(9) HCl is a 37 wt. % solution of hydrochloric acid in water.
(10) HNO$_3$ is a 65 wt. % solution of hydrochloric acid in water.
(11) PTSA is para-toluene sulphonic acid.
(12) H$_3$PO$_4$ is a 85 wt. % solution of phosphoric acid in water.
(13) H$_4$P$_2$O$_7$ is a 50 wt. % solution of pyrophosphoric acid in water.

Preparation of Overcoat Layer OC-1:

On top of the photosensitive layer, a solution in water with the composition as defined in Table 3 was coated with a bar-coater with the wet thickness setting of 20 μm, and dried at 110° C. for 2 minutes. The so-formed protective overcoat OC-1 has a dry coating weight of 0.80 g/m$^2$.

Preparation of the Printing Plate Precursors PPP-15 to PPP-22.

The compositions of the printing plate precursors PPP-15 to PPP-22 are summarized in Table 9. In the preparation of the coating solutions of P-9 to P-16, all the ingredients as given in Table 8 are mixed in the same order as indicated in Table 8.

The printing plate precursors were stored in a cabinet conditioned at 80% relative humidity at 28° C. for 5 days.

TABLE 9

Precursor composition.

| Printing Plate Precursor | Al support | Photopolymerizable layer | Type of acid | pKa acid | Overcoat layer |
|---|---|---|---|---|---|
| PPP-15 | S-1 | P-9 | — | — | OC-1 |
| PPP-16 | S-1 | P-10 | — | — | OC-1 |
| PPP-17 | S-1 | P-11 | HAc | 4.8 | OC-1 |
| PPP-18 | S-1 | P-12 | HCl | −7 | OC-1 |
| PPP-19 | S-1 | P-13 | HNO$_3$ | −1.4 | OC-1 |
| PPP-20 | S-1 | P-14 | PTSA | −6.5 | OC-1 |
| PPP-21 | S-1 | P-15 | H$_3$PO$_4$ | 2.2 | OC-1 |
| PPP-22 | S-1 | P-16 | H$_4$P$_2$O$_7$ | 0.85 | OC-1 |

Imaging

The printing plate precursors were imaged with a Creo Trendsetter IR-laser (830 nm; 2001 lpi) at an energy density of 110 mJ/cm$^2$.

Processing

The printing plate precursors were either transferred directly to the press (i.e. on-press processing with fountain and ink in the start-up of the printing process), indicated in Table 10 also as "On-press processing", or were subjected to off-press processing with Gum-1 in a CRF45 processor (dwell time 30 s, at 21° C.), available from Agfa, to remove the coating on the non-image areas from the support, indicated in Table 10 also as "Gum-processing".

Printing

The plates were printed on a Heidelberg GTO46 printing press and a print job was started using K+E Novavit 800 Skinnex ink (trademark of BASF Drucksysteme GmbH) and 3% PRIMA FS101 (trademark of Agfa) in 10% isopropanol as fountain solution, a compressible blanket and by using offset paper.

The results are summarized in Table 10. The printing plate precursors are indicated in Table 10 by the type of support, photopolymerisable layer and overcoat layer as described above in the preparation of these precursors. The clean-out is measured on the press by evaluating whether or not the printed sheets show toning. Toning is defined as the ink-accepting property on the non-image areas, exhibiting background density on the printed sheets. Toning is the result of an insufficient "clean-out", i.e. an insufficient removal of the coating at the non-exposed areas during processing such that some components of the coating remain on the substrate rendering the surface of the substrate less hydrophilic so that the ink-accepting property increases, or, alternatively, toning is the result of the combination of components adhering to the support, that are not cleaned out by processing, not being hydrophilic enough.

TABLE 10

Results.

| EXAMPLE | Printing plate precursor | Processing | Clean-out (toning) |
|---|---|---|---|
| Comparative Example 17 | PPP-15 | Gum-processing | Toning |
| Comparative Example 18 | PPP-16 | Gum-processing | Toning |
| Comparative Example 19 | PPP-17 | Gum-processing | Toning |

TABLE 10-continued

Results.

| EXAMPLE | Printing plate precursor | Processing | Clean-out (toning) |
|---|---|---|---|
| Invention Example 11 | PPP-18 | Gum-processing | No toning |
| Invention Example 12 | PPP-19 | Gum-processing | No toning |
| Invention Example 13 | PPP-20 | Gum-processing | No toning |
| Invention Example 14 | PPP-21 | Gum-processing | No toning |
| Invention Example 15 | PPP-22 | Gum-processing | No toning |

The Invention Examples 11 to 15 demonstrate that the printing plate precursors comprising an acid having a pKa-value of less than 4, added to the coating solution before the addition and mixing of the second polymer, and stored at 80% RH/28° C./5 days, deliver printing plates which do not exhibit toning on printing.

Toning is observed for the printing plates of the Comparative Examples 17 to 19, wherein the photopolymerisable layer does not comprise an acid or an acid having a pKa>4.

Invention Example 16 and Comparative Example 20

Preparation of Photosensitive Layers P-17 and P-18

The coating compositions for the photosensitive layer P-17 and P-18 were prepared by mixing the ingredients as specified in Table 11 and in the order as indicated in Table 11. The resulting solutions were filtered through a filter with a pore-size of 0.22 µm, and then coated onto the support S-1 with a bar-coater at a wet thickness setting of 10 µm. After coating, the coating was dried for 1 minute at 120° C. in a circulation oven. The resulting applied amounts are indicated in Table 11.

TABLE 11

Composition of the photosensitive layer solutions (amounts in g) and the dry coating weights (in g/m$^2$).

| INGREDIENT | P-17 | P-18 |
|---|---|---|
| MBT(5) (g) | 0.070 | 0.070 |
| Dowanol PM (1) (g) | 26.33 | 26.33 |
| HABI (4) (g) | 0.150 | 0.150 |
| Sensi-01 (3) (g) | 0.172 | 0.172 |
| ALCOTEX (2) (g) | 2.530 | 2.530 |
| HNO$_3$ (9) (g) | 0 | 0.100 |
| FST (6) (g) | 1.363 | 1.363 |
| Edaplan (7) (g) | 0.253 | 0.253 |
| Sipomer (8) (g) | 0.532 | 0.532 |
| Albritect (10) (g) | 0.266 | 0.266 |
| Dry coating weight (g/m$^2$) | 0.87 | 0.89 |

(1) and (2): see Table 2.
(3) Sensi-01 is 1,4-di[3,5-dimethoxy,4-sec-butoxy-styryl]benzene.
(4) HABI is 2,2'-bis(2-chlorophenyl)-4,4',5,5'-tetraphenyl-1,2-bisimidazole.
(5) MBT is 2-mercaptobenzthiazole.
(6) to (8): see Table 2.
(9) see Table 8.

Preparation of Overcoat Layer OC-1:

On top of the photosensitive layer, a solution in water with the composition as defined in Table 3 was coated with a bar-coater with the wet thickness setting of 40 µm, and dried at 110° C. for 2 minutes. The so-formed protective overcoat OC-1 has a dry coating is weight of 1.60 g/m$^2$.

Preparation of the Printing Plate Precursors PPP-23 and PPP-24.

The compositions of the printing plate precursors PPP-23 to PPP-24 are summarized in Table 12.

The printing plate precursors were stored in a cabinet conditioned at 80% relative humidity at 28° C. for 5 days.

TABLE 12

Precursor composition.

| Printing Plate Precursor | Al support | Photopolymerizable layer | Type acid | pKa acid | Overcoat layer |
|---|---|---|---|---|---|
| PPP-23 | S-1 | P-17 | — | — | OC-1 |
| PPP-24 | S-1 | P-18 | HNO$_3$ | −1.4 | OC-1 |

Imaging

The printing plate precursors were imaged with an Advantage DL violet platesetter, commercially available from Agfa Graphics NV, equipped with 410 nm violet laser, at 40 µJ/cm$^2$.

Processing

The printing plate precursors were subjected to an off-press processing with Gum-1 in a CRF45 processor (dwell time 30 s, at 21° C.), available from Agfa, to remove the coating in the non-image areas from the support, indicated in Table 13 also as "Gum-processing".

Printing

The plates were printed on a Heidelberg GTO46 printing press and a print job was started using K+E Novavit 800 Skinnex ink (trademark of BASF Druckmachine GmbH) and 3% PRIMA FS101 (trademark of Agfa) in 10% isopropanol as fountain solution, a compressible blanket and by using offset paper.

The results are summarized in Table 13.

TABLE 13

Results.

| EXAMPLE | Printing plate precursor | Processing | Clean-out (toning) |
|---|---|---|---|
| Comparative Example 20 | PPP-17 | Gum-processing | Toning |
| Invention Example 16 | PPP-18 | Gum-processing | No toning |

The Invention Example 16 demonstrates that the printing plate precursor comprising an acid having a pKa-value of less than 4, added to the coating solution before the addition and mixing of the second polymer, and stored at 80% RH/28° C./5 days, delivers a printing plate which does not exhibit toning on printing.

Toning is observed for the printing plates of the Comparative Example 20, wherein the photopolymerisable layer does not comprise an acid having a pKa<4.

Invention Examples 17 to 24 and Comparative Example 21

Preparation of Photosensitive Layers P-18 to P-26

The coating compositions for the photosensitive layers P-18 to P-26 were prepared by mixing the ingredients as specified in Table 14 and 15. The resulting solutions were coated with a bar-coater at a wet thickness setting of 20 μm onto a support S-1. After coating, the coating was dried for 1 minute at 120° C. in a circulation oven. The resulting applied amount is indicated in Table 14 and 15.

TABLE 14

Compositions of the photosensitive layer solutions (amounts in g) and dry coating weight (in g/m²).

| INGREDIENT | P-18 | P-19 | P-20 | P-21 | P-22 |
|---|---|---|---|---|---|
| ALCOTEX (1) (g) | 2.416 | 2.416 | 2.416 | 2.416 | 2.416 |
| IR-dye-02 (2) (g) | 0.072 | 0.072 | 0.072 | 0.072 | 0.072 |
| TBMPS (3) (g) | 0.177 | 0.177 | 0.177 | 0.177 | 0.177 |
| FST (4) (g) | 0.810 | 0.810 | 0.810 | 0.810 | 0.810 |
| Edaplan (5) (g) | 0.299 | 0.299 | 0.299 | 0.299 | 0.299 |
| Sipomer (6) (g) | 0.319 | 0.319 | 0.319 | 0.319 | 0.319 |
| Isopropanol (g) | 10.404 | 10.404 | 10.404 | 10.404 | 10.404 |
| PAA-01 (7) (g) | 0.480 | | | | |
| PAA-02 (8) (g) | | 0.480 | | | |
| PAA-03 (9) (g) | | | 0.480 | | |
| PAA-04 (10) (g) | | | | 0.480 | |
| PAA-05 (11) (g) | | | | | 0.480 |

TABLE 14-continued

Compositions of the photosensitive layer solutions (amounts in g) and dry coating weight (in g/m²).

| INGREDIENT | P-18 | P-19 | P-20 | P-21 | P-22 |
|---|---|---|---|---|---|
| Dowanol PM (g) | 20.808 | 20.808 | 20.808 | 20.808 | 20.808 |
| Dry coating weight (g/m²) | 1.066 | 1.066 | 1.066 | 1.066 | 1.066 |

(1) and (3) to (6): see previous tables.

(2) IR-dye-02 has the following structure:

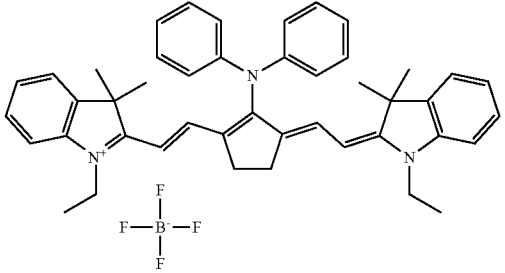 [SMILES: CCN1/C(=C/C=C2\CCC(/C=C/C3=[N+](CC)c4ccccc4C3(C)C)=C2N(c2ccccc2)c2ccccc2)C(C)(C)c2ccccc21 ; F[B-](F)(F)F]

(7) PAA-01 represents a 5 wt % solution in water of Acumer 1050, a polyacrylic acid, Mw = 2150, available as a 48% solution in water from Rohm and Haas.
(8) PAA-02 represents a 5 wt % solution in water of Acumer 1100, a polyacrylic acid, Mw = 4500, available as a 48% solution in water from Rohm and Haas.
(9) PAA-03 represents a 5 wt % solution in water of Bevaloid 6777, a polyacrylic acid, Mw = 4500, available as a 50% solution in water from Kemira.
(10) PAA-04 represents a 5 wt % solution in water of MMY-10S a polyacrylic acid, Mw = 16506, Mn = 4491, available as a 36% solution in water from NIPPON YUNYAKU.
(11) PAA-05 represents a 5 wt % solution in water of MMY-10P a polyacrylic acid, Mw = 22646, Mn = 5423, available as a powder from NIPPON YUNYAKU.

TABLE 15

Compositions of the photosensitive layer solutions (amounts in g) and dry coating weight (in g/m²).

| INGREDIENT | P-23 | P-24 | P-25 | P-26 |
|---|---|---|---|---|
| ALCOTEX (1) (g) | 2.416 | 2.416 | 2.416 | 2.416 |
| IR-dye-02 (2) (g) | 0.072 | 0.072 | 0.072 | 0.072 |
| TBMPS (3) (g) | 0.177 | 0.177 | 0.177 | 0.177 |
| FST (4) (g) | 0.810 | 0.810 | 0.810 | 0.810 |
| Edaplan (5) (g) | 0.299 | 0.2299 | 0.299 | 0.299 |
| Sipomer (6) (g) | 0.319 | 0.319 | 0.319 | 0.319 |
| Isopropanol (g) | 10.404 | 10.404 | 10.404 | 10.404 |
| PAA-06 (12) (g) | 0.480 | | | |
| PAA-07 (13) (g) | | 0.480 | | |
| PAA-08 (14) (g) | | | 0.4480 | |

TABLE 15-continued

Compositions of the photosensitive layer solutions (amounts in g) and dry coating weight (in g/m²).

| INGREDIENT | P-23 | P-24 | P-25 | P-26 |
|---|---|---|---|---|
| Dowanol PM (g) | 20.808 | 20.808 | 20.808 | 20.808 |
| Dry coating weight (g/m²) | 1.066 | 1.066 | 1.066 | 1.066 |

(1) and (3) to (6) and (8): see previous tables.
(2) IR-dye-02 has the following structure:

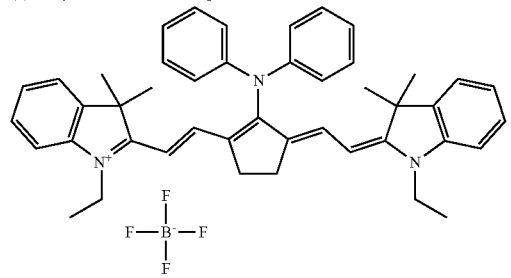

(12) PAA-06 represents a 5 wt % solution in water of Sokalan CP12S, a copolymer of acrylic acid and maleic acid, Mw = 3000, available as a 50% solution in water from BASF.
(13) PAA-07 represents a 5 wt % solution in water of Aqualic HL415, a polyacrylic acid, available as a 40% solution in water from Nippon Shokubai.
(14) PAA-08 represents a 5 wt % solution in water of MMY-10SL, a polyacrylic acid, available as a 39% solution in water from NIPPON YUNYAKU.

Preparation of Overcoat Layer OC-1:

On top of the photosensitive layer, a solution in water with the composition as defined in Table 3 was coated and dried at 110° C. for 2 minutes. The so-formed protective overcoat OC-1 has a dry thickness or dry coating weight of 0.80 g/m2.

Preparation of the Printing Plate Precursors PPP-25 to PPP-33.

The compositions of the printing plate precursors PPP-25 to PPP-33 are summarized in Table 16.

The precursors PPP-01 to PPP-09 were stored in a cabinet conditioned at 80% relative humidity at 30° C. for 5 days.

TABLE 16

Precursor composition.

| Printing Plate Precursor | Al support | Photopolymerizable layer | Overcoat layer |
|---|---|---|---|
| PPP-25 | S-1 | P-18 | OC-1 |
| PPP-26 | S-1 | P-19 | OC-1 |
| PPP-27 | S-1 | P-20 | OC-1 |
| PPP-28 | S-1 | P-21 | OC-1 |
| PPP-29 | S-1 | P-22 | OC-1 |
| PPP-30 | S-1 | P-23 | OC-1 |
| PPP-31 | S-1 | P-24 | OC-1 |
| PPP-32 | S-1 | P-25 | OC-1 |
| PPP-33 | S-1 | P-26 | OC-1 |

Imaging

The printing plate precursors were imaged with a Creo Trendsetter IR-laser (830 nm; 200 lpi) at an energy density of 130 mJ/cm².

Processing

After imaging the plate precursors were subjected to processing with Gum-1 in a CRF45 processor (dwell time 30 s, at 21° C.) available from Agfa, to remove the coating on the non-image areas from the support.

Printing

The plates were printed on a Heidelberg GTO-52Dg printing press and a print job was started using K+E800 ink and 3% Prima FS303 (Agfa)+10% iso-propanol fountain solution, a compressible blanket and by using offset paper. A critical start-up procedure was used here, whereby the plate was first printed under normal conditions to 250 sheets, the ink was disengaged and printing was continued so that the remaining ink was transferred from the imaged areas to the paper. The press was then stopped and the plate dried with compressed air. After 2 minutes, the inking form rollers were brought into contact with the plate and 10 rotations were done before the dampening form rollers were engaged (re-start-up with ink only). The 50th printed sheet was evaluated.

The results are summarized in Table 17.

The plates were evaluated by the highest resolution of the image which can be obtained on printing, i.e. the smallest dots which can be reproduced on the prints. When the smallest dot which can be reproduced ranges between 1 and 3%, the resolution is high; when the smallest dot which can be reproduced ranges between 4 to 15%, the resolution is low, and when the dot size of the smallest dot which can be reproduced is >15%, the resolution is very low. In the invention examples the resolution of the image is high.

When the non-exposed areas are insufficiently removed during processing or the compounds remaining on the substrate are too hydrophobic, toning on the prints results, i.e. non-imaged areas are ink-accepting exhibiting background density. When toning is present, determination of the image resolution is not meaningful. Only the printing plates which are capable of rendering images of high resolution without toning, are belonging to the present invention.

TABLE 17

Results.

| EXAMPLE number | Printing Plate Precursor | Image Quality (smallest dot %) |
|---|---|---|
| Invention Example-17 | PPP-25 | No toning High resolution (1%) |
| Invention Example-18 | PPP-26 | No toning High resolution (1%) |
| Invention Example-19 | PPP-27 | No toning High resolution (1%) |
| Invention Example-20 | PPP-28 | No toning High resolution (1%) |
| Invention Example-21 | PPP-29 | No toning High resolution (1%) |
| Invention Example-22 | PPP-30 | No toning High resolution (1%) |
| Invention Example-23 | PPP-31 | No toning High resolution (1%) |
| Invention Example-24 | PPP-32 | No toning High resolution (1%) |
| Comparative Example-21 | PPP-33 | Heavy Toning |

Invention Example 25 and Comparative Example 22

Preparation of Photosensitive Layers P-27 and P-28

The coating compositions for the photosensitive layer P-27 and P-28 were prepared by mixing the ingredients as specified in Table 18. In the preparation of the coating solutions of P-27 and P-28 TBMPS and Alcotex were first added to the mixture of Dowanol PM and isopropanol and subsequently 5-sulfosalicylic acid was added. Finally, all other ingredients were added. The resulting solutions were coated onto a support S-1 with a bar-coater at a wet thickness setting of 20 μm. After coating, the coating was dried for 1 minute at 120° C. in a circulation oven. The resulting applied amounts are indicated in Table 18.

TABLE 18

Composition of the photosensitive layer solutions
(amounts in g) and the dry coating weights (in g/m²).

| INGREDIENT | P-27 | P-28 |
|---|---|---|
| ALCOTEX (1) (g) | 2.416 | 2.416 |
| IR-dye-02(2) (g) | 0.072 | 0.072 |
| TBMPS (3) (g) | 0.177 | 0.177 |
| FST (4) (g) | 0.810 | 0.810 |
| Edaplan (5) (g) | 0.299 | 0.299 |
| Sipomer (6) (g) | 0.319 | 0.319 |
| Isopropanol (g) | 10.492 | 10.492 |
| Albritect (7) (g) | 0.161 | 0.161 |
| Dowanol PM (8) (g) | 20.984 | 20.984 |
| 5-sulfosalicylic acid (9) (g) | 0.053 | — |
| Dry coating weight (g/m²) | 1.085 | 1.058 |

(1) to (6) and (8): see Table 15.
(7) Albritect CP30 is a 5 wt % solution in water of a copolymer of acrylic acid and vinylphosphonic acid (70:30), commercially available from Rhodia.
(9) 5-Sulphosalicylic acid dehydrate, pKa1 = approx −6, commercially available from Acros:

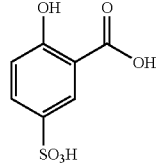 [SMILES: O=C(O)c1cc(S(=O)(=O)O)ccc1O]

Preparation of Overcoat Layer OC-1:

On top of the photosensitive layer, a solution in water with the composition as defined in Table 3 was coated and dried at 110° C. for 2 minutes. The so-formed protective overcoat OC-1 has a dry thickness or dry coating weight of 0.80 g/m².

Preparation of the Printing Plate Precursors PPP-34 and PPP-35.

The compositions of the printing plate precursors PPP-34 and PPP-35 are summarized in Table 19.

The printing plate precursors were stored in a cabinet conditioned at 80% relative humidity at 30° C. for 5 days.

TABLE 19

Precursor composition.

| Printing Plate Precursor | Al support | Photopolymerizable layer | Overcoat layer |
|---|---|---|---|
| PPP-34 | S-1 | P-27 | OC-1 |
| PPP-35 | S-1 | P-28 | OC-1 |

Imaging.

The printing plate precursors were imaged with a Creo Trendsetter IR-laser (830 nm; 200 lpi) at an energy density of 130 mJ/cm².

Processing.

After imaging the plate precursors were subjected to processing with Gum-1 in a CRF45 processor (dwell time 30 s, at 21° C.) available from Agfa, to remove the coating on the non-image areas from the support.

Printing

The plates were printed on a Heidelberg GTO-52Dg printing press and a print job was started using K+E800 ink and 3% Prima FS303 (Agfa)+10% iso-propanol fountain solution, a compressible blanket and by using offset paper. A critical start-up procedure was used here, whereby the plate was first printed under normal conditions to 250 sheets, the ink was disengaged and printing was continued so that the remaining ink was transferred from the imaged areas to the paper. The press was then stopped and the plate dried with compressed air. After 2 minutes, the inking form rollers were brought into contact with the plate and 10 rotations were done before the dampening form rollers were engaged (re-start-up with ink only). The 50th printed sheet was evaluated.

The results are summarized in Table 20. The clean-out is measured on the press by evaluating whether or not the printed sheets show toning. Toning is defined as the ink-accepting property on the non-image areas, exhibiting background density on the printed sheets. When the non-exposed areas are insufficiently removed during processing or the compounds remaining on the substrate are too hydrophobic, toning on the prints results, i.e. non-imaged areas are ink-accepting exhibiting background density.

TABLE 20

Results.

| EXAMPLE | Printing plate precursor | Clean-out (toning) | Image quality |
|---|---|---|---|
| Inventive Example 25 | PPP-34 | No toning | High resolution (2%) |
| Comparative Example 22 | PPP-35 | Heavy Toning | / |

The invention claimed is:

1. A method of making a lithographic printing plate comprising the steps of:
   a) providing a lithographic printing, plate precursor comprising a support having a hydrophilic surface or which is provided with a hydrophilic layer, and a coating provided thereon, said coating comprising (i) a contiguous photopolymerisable layer having a photopolymerisable composition, or (ii) a contiguous intermediate layer and thereon a photopolymerisable layer having a photopolymerisable composition, wherein said photopolymerisable composition comprises a polymerisable compound, a polymerization initiator and a first polymer,
   b) image-wise exposing said coating.
   c) optionally, heating the precursor, and
   d) developing the precursor by treating the coating of the precursor with a gum solution or by mounting the exposed precursor on a plate cylinder of a lithographic printing press and rotating the plate cylinder while feeding dampening liquid and/or ink, to the coating,
   wherein said contiguous photopolymerisable or intermediate layer further comprises
   (1) an adhesion promoting compound which is a non-polymeric compound containing a group having an ethylenically unsaturated bond and a group selected from a phosphate group, a phosphonate group and a trialkoxysilane group, and (2) a second polymer having at least 1 mol % of a first monomeric unit having a phosphate group, a phosphonate group, a carboxylic acid group, a sulphonic acid group, a phenolic group, a trialkoxysilane group, an ammonium group or a phosphonium group and at least 30 mol % of a second monomeric unit having a hydrophilic group, wherein the amount of said adhesion promoting compound is higher than the amount of said second polymer, with the proviso that, if the contiguous layer is the photopolymerisable layer, the amount of said second polymer in the photopolymerisable layer is at least 0.01% by weight and less than 5% by weight.

2. The method according to claim 1, wherein the amount of the first polymer in the photopolymerisable layer is between 10% wt and 90% wt relative to the total weight of the non-volatile components of the composition.

3. The method according to claim 1, wherein the group having an ethylenically unsaturated bond is a (meth)acrylate group.

4. The method according to claim 1, wherein, if the contiguous layer is the photopolymerizable layer, said contiguous photopolymerizable layer comprises the adhesion promoting compound in an amount ranging between 1 and 50 wt % of the non-volatile components of the photopolymerizable layer.

5. The method according to claim 1, wherein, if the contiguous layer is the photopolymerisable layer, the photopolymerisable layer further comprises an acid having a pKa-value of less than 4.

6. The method according to claim 5, wherein said acid is an inorganic acid or an organic sulphonic acid.

7. The method according to claim 5, wherein the acid is selected from the group consisting of hydrochloric acid, hydrobromic acid, hydroiodic acid, perchloric acid, sulphuric acid, sulphurous acid, nitric acid, phosphoric acid, pyrophosphoric acid, hypophosphoric acid, triphosphoric acid and an optionally substituted aryl or heteroaryl sulphonic acid.

8. The method according to claim 6, wherein the acid is selected from the group consisting of hydrochloric acid, hydrobromic acid, hydroiodic acid, perchloric acid, sulphuric acid, sulphurous acid, nitric acid, phosphoric acid, pyrophosphoric acid, hypophosphoric acid, triphosphoric acid and an optionally substituted aryl or heteroaryl sulphonic acid.

9. The method according to claim 2, wherein, if the contiguous layer is the photopolymerisable layer, the photopolymerisable layer further comprises an acid having a pKa-value of less than 4.

10. The method according to claim 9, wherein the acid is selected from the group consisting of hydrochloric acid, hydrobromic acid, hydroiodic acid, perchloric acid, sulphuric acid, sulphurous acid, nitric acid, phosphoric acid, pyrophosphoric acid, hypophosphoric acid, triphosphoric acid and an optionally substituted aryl or heteroaryl sulphonic acid.

11. A lithographic printing plate precursor comprising
a support having a hydrophilic surface or which is provided with a hydrophilic layer, and
a coating provided thereon, said coating comprising (i) a contiguous photopolymerisable layer having a photopolymerisable composition, or (ii) a contiguous intermediate layer and thereon a photopolymerisable layer having a photopolymerisable composition,
wherein said photopolymerisable composition comprises a polymerisable compound, a polymerization initiator and a first polymer,
wherein said contiguous photopolymerisable or intermediate layer further comprises (1) an adhesion promoting compound which is a non-polymeric compound containing a group having an ethylenically unsaturated bond and a group selected from a phosphate group, a phosphonate group and a trialkoxysilane group, and (2) a second polymer having at least 1 mol % of a first monomeric unit having a phosphate group, a phosphonate group, a carboxylic acid group, a sulphonic acid group, a phenolic group, a trialkoxysilane group, an ammonium group or a phosphonium group and at least 30 mol % of a second monomeric unit having a hydrophilic group,
wherein the amount of said adhesion promoting compound is higher than the amount of said second polymer,
with the proviso that, if the contiguous layer is the photopolymerisable layer, the amount of said second polymer in the photopolymerisable layer is at least 0.01% by weight and less than 5% by weight, and
wherein said photopolymerisable coating layer is capable of being removed by applying a gum solution and optionally brushing the precursor, or by mounting the precursor on a plate cylinder of a lithographic printing press and rotating the plate cylinder while feeding dampening liquid and/or ink to the coating layer.

12. The printing plate precursor according to claim 11, wherein, if the contiguous layer is the photopolymerisable layer, said photopolymerisable layer further comprises an acid having a pKa-value of less than 4.

13. The printing plate precursor according to claim 12, wherein said acid is an inorganic acid or an organic sulphonic acid.

14. The printing plate precursor according to any of claim 12, wherein the acid is selected from the group consisting of hydrochloric acid, hydrobromic acid, hydroiodic acid, perchloric acid, sulphuric acid, sulphurous acid, nitric acid, phosphoric acid, pyrophosphoric acid, hypophosphoric acid, triphosphoric acid and an optionally substituted aryl or heteroaryl sulphonic acid.

15. The printing plate precursor according to any of claim 13, wherein the acid is selected from the group consisting of hydrochloric acid, hydrobromic acid, hydroiodic acid, perchloric acid, sulphuric acid, sulphurous acid, nitric acid, phosphoric acid, pyrophosphoric acid, hypophosphoric acid, triphosphoric acid and an optionally substituted aryl or heteroaryl sulphonic acid.

16. The lithographic printing plate precursor according to claim 11, wherein the amount of the first polymer in the photopolymerisable layer is between 10% wt and 90% wt relative to the total weight of the non-volatile components of the composition.

17. The printing plate precursor according to claim 16, wherein, if the contiguous layer is the photopolymerisable layer, said photopolymerisable layer further comprises an acid having a pKa-value of less than 4.

18. The printing plate precursor according to claim 17, wherein said acid is an inorganic acid or an organic sulphonic acid.

19. The printing plate precursor according to claim 17, wherein the acid is selected from the group consisting of hydrochloric acid, hydrobromic acid, hydroiodic acid, perchloric acid, sulphuric acid, sulphurous acid, nitric acid, phosphoric acid, pyrophosphoric acid, hypophosphoric acid, triphosphoric acid and an optionally substituted aryl or heteroaryl sulphonic acid.

20. The printing plate precursor according to claim 18, wherein the acid is selected from the group consisting of hydrochloric acid, hydrobromic acid, hydroiodic acid, perchloric acid, sulphuric acid, sulphurous acid, nitric acid, phosphoric acid, pyrophosphoric acid, hypophosphoric acid, triphosphoric acid and an optionally substituted aryl or heteroaryl sulphonic acid.

21. The lithographic printing plate precursor according to claim 11, wherein the group having an ethylenically unsaturated bond is a (meth)acrylate group.

22. The lithographic printing plate precursor according to claim 11, wherein, if the contiguous layer is the photopolymerisable layer, the contiguous photopolymerizable layer comprises the adhesion promoting compound in an amount ranging between 1 and 50 wt % of the non-volatile components of the photopolymerizable layer.

23. A method of making a lithographic printing plate precursor comprising the steps of:
 1) providing a support having a hydrophilic surface or which is provided with a hydrophilic layer,
 2) preparing a photopolymerisable coating solution by adding and mixing ingredients to a solvent or a mixture of solvents, said solution comprising the following ingredients:
  a polymerizable compound,
  a polymerization initiator,
  a first polymer,
  an adhesion promoting compound which is a non-polymeric compound containing a group having an ethylenically unsaturated bond and a group selected from a phosphate group, a phosphonate group and a trialkoxysilane group,
  a second polymer having at least 1 mol % of a first monomeric unit having a phosphate group, a phosphonate group, a carboxylic acid group, a sulphonic acid group, a phenolic group, a trialkoxysilane group, an ammonium group or a phosphonium group and at least 30 mol % of a second monomeric unit having a hydrophilic group, and
  an acid having a pKa-value of less than 4, and
 3) forming a photopolymerisable coating layer by coating said photopolymerisable coating solution on the hydrophilic surface or hydrophilic layer of the support,
 wherein the amount of said adhesion promoting compound is higher than the amount of said second polymer,
 wherein the amount of said second polymer in the photopolymerisable layer is at least 0.01% by weight and less than 5% by weight,
 wherein said photopolymerisable coating layer is capable of being removed by applying a gum solution and optionally brushing the precursor, or by mounting the precursor on a plate cylinder of a lithographic printing press and rotating the plate cylinder while feeding dampening liquid and/or ink to the coating layer.

24. The method according to claim 23, wherein in the preparation of the coating solution in step 2), the ingredients are added and mixed in an order wherein said acid is added and mixed before said second polymer is added and mixed.

25. The method according to claim 23, wherein the acid is selected from the group consisting of hydrochloric acid, hydrobromic acid, hydroiodic acid, perchloric acid, sulphuric acid, sulphurous acid, nitric acid, phosphoric acid, pyrophosphoric acid, hypophosphoric acid, triphosphoric acid and an optionally substituted aryl or heteroaryl sulphonic acid.

26. The method according to claim 23, wherein the amount of the first polymer in the photopolymerisable layer is between 10% wt and 90% wt relative to the total weight of the non-volatile components of the composition.

27. The method according to claim 23, wherein the group having an ethylenically unsaturated bond is a (meth)acrylate group.

28. The method according to claim 23, wherein the photopolymerizable layer comprises the adhesion promoting compound in an amount ranging between 1 and 50 wt % of the non-volatile components of the photopolymerizable layer.

* * * * *

UNITED STATES PATENT AND TRADEMARK OFFICE
CERTIFICATE OF CORRECTION

PATENT NO. : 8,415,087 B2  Page 1 of 1
APPLICATION NO. : 12/738901
DATED : April 9, 2013
INVENTOR(S) : Williamson et al.

It is certified that error appears in the above-identified patent and that said Letters Patent is hereby corrected as shown below:

On Title Page, Item (73): replace "Morsel with --Mortsel--

On the Title Page:

The first or sole Notice should read --

Subject to any disclaimer, the term of this patent is extended or adjusted under 35 U.S.C. 154(b) by 308 days.

In the Claims:

Col. 48, in claim 1, line 3: replace "printing," with --printing--

Col. 48, in claim 1, line 19: replace "ink," with --ink--

Signed and Sealed this
Eighteenth Day of June, 2013

Teresa Stanek Rea
*Acting Director of the United States Patent and Trademark Office*